(12) United States Patent
Zhu et al.

(10) Patent No.: US 9,215,034 B2
(45) Date of Patent: Dec. 15, 2015

(54) SIGNAL RECONSTRUCTION METHOD AND APPARATUS

(71) Applicant: Huawei Technologies Co., Ltd., Shenzhen (CN)

(72) Inventors: Hufei Zhu, Shenzhen (CN); Ganghua Yang, Paris (FR)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/554,355

(22) Filed: Nov. 26, 2014

(65) Prior Publication Data

US 2015/0078489 A1    Mar. 19, 2015

Related U.S. Application Data

(63) Continuation of application No. PCT/CN2013/075315, filed on May 8, 2013.

(30) Foreign Application Priority Data

May 30, 2012    (CN) .......................... 2012 1 0174062

(51) Int. Cl.
*H03F 1/26*    (2006.01)
*G06K 9/36*    (2006.01)
(Continued)

(52) U.S. Cl.
CPC ........... *H04L 1/0036* (2013.01); *H03M 7/3062* (2013.01); *H03M 7/6047* (2013.01); *H04B 1/16* (2013.01)

(58) Field of Classification Search
CPC ...... H03M 7/46; H03M 1/121; H03M 7/6047
See application file for complete search history.

(56) References Cited

U.S. PATENT DOCUMENTS

2006/0029279 A1*  2/2006  Donoho ............... G06K 9/0057
                                                  382/232
2007/0027656 A1*  2/2007  Baraniuk ............ G06K 9/0057
                                                  702/189
(Continued)

FOREIGN PATENT DOCUMENTS

CN    101640541 A    2/2010
CN    101895297 A    11/2010
CN    101908889 A    12/2010

OTHER PUBLICATIONS

Rui, G., et al., "Variable Step Size Adaptive Matching Pursuit Algorithm for Image Reconstruction Based on Compressive Sensing," ACTA Optica Sinica, vol. 30, No. 6, Jun. 2010, pp. 1639-1644.
(Continued)

*Primary Examiner* — Chieh M Fan
*Assistant Examiner* — Sarah Hassan
(74) *Attorney, Agent, or Firm* — Conley Rose, P.C.; Grant Rodolph; Nicholas K. Beaulieu

(57) ABSTRACT

A method includes determining a correlation between a first residual error and multiple columns in a sensing matrix according to a measured value of an original signal and the sensing matrix, and determining a first array most correlative to the measured value of the original signal in the sensing matrix according to the correlation between the first residual error and the multiple columns; determining a correlation between a $k^{th}$ residual error and the multiple columns according to a correlation between a $(k-1)^{th}$ residual error and the multiple columns, and determining a $k^{th}$ array most correlative to the measured value of the original signal according to the correlation between the $k^{th}$ residual error and the multiple columns in the sensing matrix, where $2 \le k \le K$; and recovering the original signal after determining a $K^{th}$ array most correlative to the measured value of the original signal.

18 Claims, 8 Drawing Sheets

(51) Int. Cl.
*H04J 14/00* (2006.01)
*H04L 1/00* (2006.01)
*H03M 7/30* (2006.01)
*H04B 1/16* (2006.01)

(56) References Cited

U.S. PATENT DOCUMENTS

| | | | |
|---|---|---|---|
| 2008/0219579 A1* | 9/2008 | Aksyuk | G02B 26/06 382/248 |
| 2009/0141995 A1 | 6/2009 | Chakraborty et al. | |
| 2009/0196513 A1* | 8/2009 | Tian | H04N 19/60 382/232 |
| 2010/0066993 A1* | 3/2010 | Lepere | G01S 17/89 356/4.01 |
| 2010/0246920 A1* | 9/2010 | Vaswani | 382/131 |
| 2011/0227964 A1* | 9/2011 | Chaji | G09G 3/006 345/690 |
| 2012/0251013 A1* | 10/2012 | Porikli | H03M 7/30 382/233 |
| 2012/0259590 A1* | 10/2012 | Ye et al. | 702/189 |

OTHER PUBLICATIONS

Cai, T., et al., "Orthogonal Matching Pursuit for Sparse Signal Recovery With Noise," IEEE Transactions on Information Theory, vol. 57, No. 7, Jul. 2011, pp. 4680-4688.

Foreign Communication From a Counterpart Application, European Application No. 13796618.0, Extended European Search Report dated Jul. 8, 2015, 5 pages.

Liu, B., et al., "Compressive sensing signal detection algorithm based on orthogonal matching pursuit," Chinese Journal of Scientific Instrument, vol. 31, No. 9, Sep. 2010, 6 pages.

Tropp, J., et al., "Signal Recovery From Random Measurements via Orthogonal Matching Pursuit," IEEE Transactions on Information Theory, vol. 53, No. 12, Dec. 2007, pp. 4655-4666.

Gao, R., et al., "Matching Pursuit Algorithm for Image Reconstruction Based on Compressive Sensing," Jun. 2009, 24 pages.

English Translation of "Matching Pursuit Algorithm for Image Reconstruction Based on Compressive Sensing," Mar. 6, 2015, 2 pages.

Foreign Communication From a Counterpart Application, PCT Application No. PCT/CN2013/075315, English Translation of International Search Report dated Aug. 15, 2013, 3 pages.

Foreign Communication From a Counterpart Application, PCT Application No. PCT/CN2013/075315, English Translation of Written Opinion dated Aug. 15, 2013, 11 pages.

* cited by examiner

SIGNAL RECONSTRUCTION METHOD AND APPARATUS

CROSS-REFERENCE TO RELATED APPLICATION

This application is a continuation of International Application No. PCT/CN2013/075315, filed on May 8, 2013, which claims priority to Chinese Patent Application No. 201210174062.5, filed on May 30, 2012, both of which are hereby incorporated by reference in their entireties.

TECHNICAL FIELD

The present invention relates to the communications field, and in particular, to a signal reconstruction method and apparatus.

BACKGROUND

A conventional signal processing process may include four parts, namely, sampling, compression, storage/transmission, and decompression. In the sampling process, data collection is first performed for an original signal according to the Nyquist sampling theorem, and then the collected data is compressed. In the compression process, the collected data is transformed first, and then a few coefficients with large absolute values are compressed and encoded, and other coefficients equal or close to zero are discarded. In the compression process, a majority of data obtained through the sampling is discarded.

In recent years, a new signal collection technology has been put forward, that is, a compressed sensing technology. The compressed sensing technology takes advantage of a feature that an original signal S is sparse. That is to say, the original signal has only K_sparse non-zero items with unknown positions after experiencing orthogonal transformation. The amount of data measured by using the compressed sensing technology is much smaller than the amount of data required in conventional sampling.

In the process of implementing compressed sensing, a measured value (non-adaptive linear projection) of the original signal S is obtained first, where the measured value is represented by equation (1.1):

$$y = \Phi s \quad (1.1)$$

In the above equation, y is the measured value, $\Phi$ is a measurement matrix, and S is the original signal. The original signal S is represented as a column vector with N items, and has a sparse expression. That is to say, $\Psi s = x$ obtained after orthogonal transformation $\Psi$ has only K_sparse (K_sparse<<N) non-zero items with unknown positions. The measured value y is a column vector with M items (M<<N & M>2K_sparse), and the measurement matrix $\Phi$ has M rows and N columns.

After the measured value y of the original signal is obtained and then stored/transmitted, signal reconstruction may be performed. In the prior art, a signal reconstruction method is: first, under a constraint condition y=Tx, X is found; and then according to equation $s = \Psi^H x$, S is calculated, where a matrix $T = \Phi \Psi^H$ is called a sensing matrix, $\Phi$ is a measurement matrix, and $\Psi$ is the orthogonal transformation. The sensing matrix T is also called a dictionary, and each column in the dictionary is also referred to as an atom.

The signal can be reconstructed by using an orthogonal matching pursuit method, which is implemented through the following steps.

Step 1: First, initialize variables for iteration, which is detailed as follows.

Step 1.1: Set an initial value $\tilde{y}$ of a residual error to make $\tilde{y} = y$.

Step 1.2: Set an initial value of a base matrix B to be an empty matrix: $B_0 = []$. The base matrix B selects column K that best matches a received signal y from a dictionary T to build a sparse approximation of y, and an index of a column already selected by the base matrix B is denoted as a column vector $\tau$, and its initial value $\tau_0$ is an empty vector.

Step 1.3: Before the $k^{th}$ iteration in an iteration process starts, denote a column that is not selected into the base matrix B in a sensing matrix as $T_{N+1-k} = T_{\sqcup^-(k-1)}$, where $\sqcap^-(k-1) = N-k+1$, $T_{N+1-k} = T_{\sqsubset^-(k-1)}$ has $N+1-k$ columns, and an initial value is $T_N = T$.

An initial value of an estimated value of sparse expression x is set to $\hat{x} = 0_N$, where $0_N$ represents a zero column vector with N items, that is, a column vector with each item being zero.

The modulus of each column in the sensing matrix T is denoted as a column vector $\delta_{\sqcup^-(0)} = [\|t_{(1)}\|_2 \ \|t_{(2)}\|_2 \ \ldots \ \|t_{(N)}\|_2]^T$, where $t_{(i)}$ (i=1, 2, ..., N) represents the $i^{th}$ column of T, $\|t_{(i)}\|_2$ represents the modulus of a vector $t_{(i)}$, and $[\bullet]^T$ represents transposition of the vector or a matrix $[\bullet]$.

A column vector $\pi_{\sqcup^-(0)} = \pi_N = [1 \ 2 \ \ldots \ N]^T$ records sequence numbers of atoms that are not selected into the base matrix B.

Step 2: The initial value of k is 1. Then the following iteration starts.

Step 2.1: Calculate, by using formula (1.2), a correlation between the $k^{th}$ residual error and each column in the sensing matrix from which k−1 columns are deleted:

$$q_{\sqsubset^-(k-1)} = T^H_{\sqcup^-(k-1)} \tilde{y} \quad (1.2)$$

In the above formula, $\sqcap^-(k-1) = N-k+1$, $T_{\sqsubset^-(k-1)}$ represents a matrix with M rows and $\sqcup^-(k-1)$ columns, and when k=1, the residual error $\tilde{y} = y$, that is, the residual error $\tilde{y}$ is equal to a measured value vector; and when k=1, $T_{\sqcup^-(k-1)} = T_{\sqcup^-(0)} = T_N = T$, that is, $T_{\sqcap^-(k-1)}$ is the sensing matrix T; and $q_{\sqsubset^-(k-1)}$ is a column vector with $\sqsubset^-(k-1)$ items, and its $i^{th}$ item represents the value of correlation between the $i^{th}$ column of $T_{\sqsubset^-(k-1)}$ and the residual error $\tilde{y}$. It should be noted that, $T_{\sqcap^-(k-1)}$ includes $\sqsubset^-(k-1)$ columns, which are $\sqsubset^-(k-1)$ columns to be selected in the sensing matrix T, that is, $\sqcap^-(k-1)$ atoms to be selected in the sensing matrix T; and $T_{\sqcap^-(k-1)}$ is obtained by deleting k−1 columns from the sensing matrix T, where the k−1 columns have been selected and placed into the base matrix.

Step 2.2: Determine, by using formula (1.3), a sequence number of a column with the maximum correlation value:

$$\rho_k = \operatorname*{argmax}_{i=1}^{\sqcap^-(k-1)} |q_i| / \delta_i \quad (1.3)$$

In the above formula, $q_i$ represents the $i^{th}$ item of $q_{\sqcup^-(k-1)}$, $\delta_i$ represents the $i^{th}$ item of $\delta_{\sqcup^-(k-1)}$, $\delta_{\sqcup^-(k-1)}$ is a modulus of each column of $T_{\sqcup^-(k-1)}$, and $|\bullet|$ represents the absolute value of a scalar $\bullet$.

Step 2.3: Update the column $T_{\sqcup^-(k-1)}$ to be selected by the selected base matrix B and the sensing matrix.

A $k^{th}$ column is added to the base matrix B to make $B_k = [B_{k-1} \ t_{(\rho_k)}]$, where $t_{(\rho_k)}$ represents the $\rho_k^{th}$ column of $T_{\sqcap^-(k-1)}$. Correspondingly, the $\rho_k^{th}$ column, $t_{(\rho_k)}$, is deleted from $T_{\sqcup^-(k-1)}$ to obtain $T_{\sqsubset^-(k)}$ for subsequent iteration. The initial value $B_{k-1} = B_{1-1} = B_0$ of the base matrix B is an empty matrix.

Step 2.4: According to $\tau_{k-1}$, obtain an index $\tau_k$ of each column of the base matrix $B_k$; and according to an index $\pi_{\sqcap_{-(k-1)}}$ of each column of $T_{\sqcap_{-(k)}}$ and the modulus $\delta_{\sqcup_{-(k-1)}}$ of each column, obtain an index $\pi_{\sqcap_{-(k)}}$ of each column of $T_{-(k)}$ and the modulus $\delta_{\sqcup_{-(k)}}$ of each column. $\tau_k = [\tau_{k-1}^T \; \pi_{\rho_k}]^T$ is obtained, where $\pi_{\rho_k}$ is the $\rho_k^{th}$ item in $\pi_{\sqcap_{-(k-1)}}$; the $\rho_k^{th}$ item, $\pi_{\rho_k}$, is deleted from $\pi_{\sqcap_{-(k-1)}}$ to obtain $\pi_{\sqcap_{-(k)}}$ for subsequent iteration; and the $\rho_k^{th}$ item is deleted from $\delta_{\sqcup_{-(k-1)}}$ to obtain $\delta_{\sqcup_{-(k)}}$ for subsequent iteration.

Step 2.5: Update a weight coefficient of each column selected in the base matrix B and a corresponding residual error.

First, a column vector $z_k$ composed of the weight coefficients of the columns selected in the base matrix B is calculated by using formula (1.4):

$$z_k = (B_k^H B_k)^{-1} B_k^H y \tag{1.4}$$

In the above formula, $(\bullet)^{-1}$ represents an inverse matrix of the matrix $(\bullet)$. Then, the residual error $\tilde{y}$ is obtained by using formula (1.5):

$$\tilde{y} = y - B_k z_k \tag{1.5}$$

If k<K (generally, K is smaller than or equal to K_sparse), the value of k increases by 1, and the process goes back to step 1.

Step 3: Recover the signal.

The initial value of the estimated value of sparse expression x is $\hat{x} = 0_N$. In $\hat{x}$, let the $\rho_k^{th}$ item be $\hat{x}_{\tau_k} = z_k$ (k=1, 2, ..., K), where $z_k$ is the $k^{th}$ item of $z_K$, and $\tau_k$ is the $k^{th}$ item of the vector $\tau_k$. Then the original signal is calculated as $\hat{s} = \Psi^H \hat{x}$.

As can be seen from the above, when determining each column of the base matrix, it is necessary to determine the correlation between $T_{\sqcap_{-(k-1)}}^{\prime\prime}$ and each column of the residual error by using formula $\tilde{q}_{\sqcup_{-(k-1)}} = T_{\sqcup_{-(k-1)}}^{\prime\prime} \tilde{y}$. $T_{\sqcup_{-(k-1)}}^{\prime\prime}$ is a vector with $|^-(k-1)$ rows and N columns, where the value of N is very large; therefore, the complexity of calculating $T_{\sqcup_{-(k-1)}}^{\prime\prime} \tilde{y}$ is extremely high.

Therefore, an appropriate method is desired to ensure proper recovery of a signal and reduce the amount of calculation for reconstructing the signal.

SUMMARY

Embodiments of the present invention provide a signal reconstruction method to ensure proper recovery of a signal and reduce the amount of calculation for reconstructing the signal.

In a first aspect, a signal reconstruction method is provided, including determining a correlation between a first residual error and multiple columns in a sensing matrix according to a measured value of an original signal and the sensing matrix, and determining a first array most correlative to the measured value of the original signal in the sensing matrix according to the correlation between the first residual error and the multiple columns in the sensing matrix; determining a correlation between a $k^{th}$ residual error and the multiple columns in the sensing matrix according to a correlation between a $(k-1)^{th}$ residual error and the multiple columns in the sensing matrix, and determining a $k^{th}$ array most correlative to the measured value of the original signal in the sensing matrix according to the correlation between the $k^{th}$ residual error and the multiple columns in the sensing matrix, where $2 \leq k \leq K$; and recovering the original signal after determining a $K^{th}$ array most correlative to the measured value of the original signal in the sensing matrix.

With reference to the first aspect, in a first possible implementation manner of the first aspect, the determining a correlation between a $k^{th}$ residual error and the multiple columns in the sensing matrix according to a correlation between a $(k-1)^{th}$ residual error and the multiple columns in the sensing matrix includes: from the correlation between the $(k-1)^{th}$ residual error and the multiple columns in the sensing matrix, subtracting a product of a $(k-1)^{th}$ base difference and a $(k-1)^{th}$ difference coefficient to obtain the correlation between the $k^{th}$ residual error and the multiple columns in the sensing matrix, where the $(k-1)^{th}$ base difference is a vector or a vector set, and the $(k-1)^{th}$ difference coefficient is a scalar or a scalar set or a set of vectors composed of multiple scalars.

With reference to the first possible implementation manner of the first aspect, in a second possible implementation manner of the first aspect, before the from the correlation between the $(k-1)^{th}$ residual error and the multiple columns in the sensing matrix, subtracting a product of a $(k-1)^{th}$ base difference and a $(k-1)^{th}$ difference coefficient to obtain the correlation between the $k^{th}$ residual error and the multiple columns in the sensing matrix, the determining a correlation between a $k^{th}$ residual error and the multiple columns in the sensing matrix further includes: if k=2, determining a first base difference; if k=3, determining the $(k-1)^{th}$ base difference according to a first base difference; or if k≥4, determining the $(k-1)^{th}$ base difference according to first to $(k-2)^{th}$ base differences.

With reference to the second possible implementation manner of the first aspect, in a third possible implementation manner of the first aspect, the determining a first base difference includes determining the first base difference $\bar{t}_{N-1}$ by using formula $\bar{t}_1 = \lambda_1 \cdot \theta_{(\rho_1)}$; and the determining the $(k-1)^{th}$ base difference includes determining the $(k-1)^{th}$ base difference by using formula $\bar{t}_{k-1} = -\lambda_{k-1} T_{k-2} \tilde{u}_{k-2} + \lambda_{k-1} \theta_{(\rho_{k-1})}$, where $\lambda_1 = \sqrt{1/\theta_{\rho_1,\rho_1}}$, $\theta_{(\rho_1)}$ is a $\rho_1^{th}$ column of $\Theta$, $\theta_{\rho_1,\rho_1}$ is an item in a $\rho_1^{th}$ row and a $\rho_1^{th}$ column in $\Theta$, $\Theta$ is a correlation matrix of the sensing matrix, $\rho_1$ is a sequence number of a column in the sensing matrix, where the column is a column of a first array most correlative to the measured value of the original signal in the sensing matrix, $T_1 = [\bar{t}_1]$, $T_{k-2} = [T_{k-3} \; \bar{t}_{k-2}]$, $\lambda_{k-1} = 1/\sqrt{\theta_{\rho_{k-1},\rho_{k-1}} - \tilde{u}_{k-2}^H \tilde{u}_{k-2}}$, $\tilde{u}_{k-2} = (\bar{t}_{(\rho,:)}^H)^H$, $\theta_{\rho_{k-1},\rho_{k-1}}$ is an item in a $\rho_{k-1}^{th}$ row and a $\rho_{k-1}^{th}$ column in $\Theta$, $\bar{t}_{\rho_k:)}^H$ is a $\rho_{k-1}^{th}$ row in $T_{k-2}$, and $\rho_{k-1}$ is a sequence number of a column in the sensing matrix, where the column is a column of a $(k-1)^{th}$ array most correlative to the measured value of the original signal in the sensing matrix.

With reference to the third possible implementation manner of the first aspect, in a fourth possible implementation manner of the first aspect, before the from the correlation between the $(k-1)^{th}$ residual error and the multiple columns in the sensing matrix, subtracting a product of a $(k-1)^{th}$ base difference and a $(k-1)^{th}$ difference coefficient to obtain the correlation between the $k^{th}$ residual error and the multiple columns in the sensing matrix, the determining a correlation between a $k^{th}$ residual error and the multiple columns in the sensing matrix further includes determining the $k^{th}$ difference coefficient $\alpha_k$ by using formula $\alpha_k = \lambda_k q_{\rho_k}^{k-1}$.

With reference to the third or fourth possible implementation manner of the first aspect, in a fifth possible implementation manner of the first aspect, the method further includes determining $F_1$ by using formula $F_1 = [\lambda_1]$; and if $2 \leq k \leq K$, determining $F_k$ by using formula $$F_k = \begin{bmatrix} F_{k-1} & u_{k-1} \\ 0_{k-1}^T & \lambda_k \end{bmatrix},$$

where $u_{k-1}=-\lambda_k F_{k-1}\tilde{u}_{k-1}$; and the recovering the original signal of the received signal after determining a $K^{th}$ array of the base matrix includes recovering the signal according to the $F_K$.

With reference to the fifth possible implementation manner of the first aspect, in a sixth possible implementation manner of the first aspect, the recovering the signal according to the $F_K$ includes determining a weight coefficient column vector $z_K$ by using formula $z_K=F_K a_K$; determining x according to the weight coefficient column vector to make $\hat{x}_{\tau_k}=z_k$, where $z_k$ is a $k^{th}$ item of $z_K$, and $\tau_k$ is a column in an array most correlative to the measured value of the original signal in the sensing matrix; and obtaining the original signal according to the x.

With reference to the second possible implementation manner of the first aspect, in a seventh possible implementation manner of the first aspect, the determining a first base difference includes determining a first column and a second column of $T_2$ as the first base difference; and the determining the $(k-1)^{th}$ base difference includes determining a $(2k-3)^{th}$ column and a $(2k-2)^{th}$ column of $T_{2k-2}$ as the $(k-1)^{th}$ base difference, where $T_2=[\lambda_1\theta_{(\rho_1)} \; f_{1,2}\theta_{(\rho_1)}+\lambda_2 \times \text{flipud}(\theta^*_{(\rho_1)})]$,
$T_{2k-2}=[T_{2k-4} \; \lambda_{2k-3}\tilde{t}_k \; (f_{2k-3,2k-2}\tilde{t}_{k-1}+\lambda_{2k-2}\times\text{flipud}(\tilde{t}^*_{k-1}))]$,
$\lambda_1=\sqrt{1/\theta_{\rho_1,\rho_1}}$, $\theta_{\rho_1,\rho_1}$ represents an item in a $\rho_1^{th}$ row and a $\rho_1^{th}$ column in the sensing matrix $\Theta$, $\theta_{(\rho_1)}$ is the $\rho_1^{th}$ column in the sensing matrix $\Theta$, $f_{1,2}=-\lambda_2\lambda_1 u''_1$, $\lambda_2=1/\sqrt{\theta_{\rho_1,\rho_1}-(u''_1)^*u''_1}$, $u''_1=\lambda_1\times\theta_{\rho_1,N-\rho_1+1}$, $\theta_{\rho_1,N-\rho_1+1}$ represents an item in the $\rho_1^{th}$ row and a $(N-\rho_1+1)^{th}$ column in the sensing matrix $\Theta$, $q_{\rho_1,:}^H$ is the $\rho_1^{th}$ row of Q, Q is a matrix composed of correlations between the first residual error and the multiple columns in the sensing matrix, $\lambda_{2k-3}=1/\sqrt{\theta_{\bar{\rho}_{k-1},\bar{\rho}_{k-1}}-\tilde{u}'_{2k-4}{}^H\tilde{u}'_{2k-4}}$, $\tilde{u}'_{2k-4}=(T_{2k-4}(\bar{\rho}_{k-1},:))^H$, $T_{2k-4}(\bar{\rho}_{k-1},:)$ represents a $\bar{\rho}_{k-1}^{th}$ row in the matrix $T_{2k-4}$, $f_{2k-3,2k-2}=-\lambda_{2k-2}\lambda_{2k-3}\tilde{u}''_{2k-3}$, $\lambda_{2k-2}=1/\sqrt{1/\lambda_{2k-3}^2-|\tilde{u}''_{2k-3}|^2}$, $\tilde{u}''_{2k-3}=\lambda_{2k-3}(\theta_{\bar{\rho}_{k-1},\rho_{k-1}}-T_{2k-4}(\bar{\rho}_{k-1},:)\times\tilde{u}'_{2k-4})^*$, $\tilde{t}_{k-1}=\theta_{(\rho_{k-1})}-T_{2k-4}\tilde{u}'_{2k-4}$, and $\theta_{(\rho_{k-1})}$ is a $\rho_{k-1}^{th}$ column in the matrix $\Theta$.

With reference to the seventh possible implementation manner of the first aspect, in an eighth possible implementation manner of the first aspect, before the from the correlation between the $(k-1)^{th}$ residual error and the multiple columns in the sensing matrix, subtracting a product of a $(k-1)^{th}$ base difference and a $(k-1)^{th}$ difference coefficient to obtain the correlation between the $k^{th}$ residual error and the multiple columns in the sensing matrix, the determining a correlation between a $k^{th}$ residual error and the multiple columns in the sensing matrix further includes determining a first row and a second row of $A_2$ as a first difference coefficient; and determining a $(2k-3)^{th}$ row and a $(2k-2)^{th}$ row of $A_{2k-2}$ as the $(k-1)^{th}$ difference coefficient, where $$A_{2k-2} = \begin{bmatrix} A_{(2k-4)} \\ \lambda_{2k-3}\tilde{a}_{2k-4,:}^H \\ (f_{2k-3,2k-2})^* \tilde{a}_{2k-4,:}^H + \lambda_{2k-2}(\tilde{a}_{2k-4,:}^H)^* \end{bmatrix},$$

and $$A_2 = \begin{bmatrix} \lambda_1 q_{\rho_1,:}^H \\ f_{1,2}^* q_{\rho_1,:}^H + \lambda_2(q_{\rho_1,:}^H)^* \end{bmatrix}.$$

With reference to the seventh or eighth possible implementation manner of the first aspect, in a ninth possible implementation manner of the first aspect, the method further includes determining $F_2$ by using formula $$F_2 = \begin{bmatrix} \lambda_1 & f_{1,2} \\ 0 & \lambda_2 \end{bmatrix};$$

and if $2 \le k \le K$, determining $F_{2k}$ by using formula:

$$F_{2k} = \begin{bmatrix} F_{2k-2} & -\lambda_{2k-1}w_{2k-2} & (-f_{2k-1,2k}w_{2k-2}-\lambda_{2k}\times\text{reorder}(w_{2k-2})) \\ 0_{2k-2}^H & \lambda_{2k-1} & f_{2k-1,2k} \\ 0_{2k-2}^H & 0 & \lambda_{2k} \end{bmatrix},$$

where reorder($w_{2k-2}$) refers to exchanging positions of a $(2i-1)^{th}$ item and a $2i^{th}$ item of a vector $w_{2k-2}$, and then calculating a conjugate of each item of the vector, where $i=1, 2, \ldots, k-1$, and $w_{2k-2}=F_{2k-2}\tilde{u}'_{2k-2}$; and the recovering the original signal of the received signal after determining a $K^{th}$ column of the base matrix includes recovering the signal according to the $F_{2K}$.

In a second aspect, a signal reconstruction apparatus is provided, including a first determining unit configured to determine a correlation between a first residual error and multiple columns in a sensing matrix according to a measured value of an original signal and the sensing matrix, and determine a first array most correlative to the measured value of the original signal in the sensing matrix according to the correlation between the first residual error and the multiple columns in the sensing matrix; a second determining unit configured to determine a correlation between a $k^{th}$ residual error and the multiple columns in the sensing matrix according to a correlation between a $(k-1)^{th}$ residual error and the multiple columns in the sensing matrix, and determine a $k^{th}$ array most correlative to the measured value of the original signal in the sensing matrix according to the correlation between the $k^{th}$ residual error and the multiple columns in the sensing matrix, where $2 \le k \le K$; and a recovering unit configured to recover the original signal after the second determining unit determines a $K^{th}$ array most correlative to the measured value of the original signal in the sensing matrix.

With reference to the second aspect, in a first possible implementation manner of the second aspect, the second determining unit is configured to, from the correlation between the $(k-1)^{th}$ residual error and the multiple columns in the sensing matrix, subtract a product of a $(k-1)^{th}$ base difference and a $(k-1)^{th}$ difference coefficient to obtain the correlation between the $k^{th}$ residual error and the multiple columns in the sensing matrix, where the $(k-1)^{th}$ base difference is a vector or a vector set, and the $(k-1)^{th}$ difference coefficient is a scalar or a scalar set or a set of vectors composed of multiple scalars.

With reference to the first possible implementation manner of the second aspect, in a second possible implementation manner of the second aspect, the second determining unit is further configured to: if $k=2$, determine a first base difference; if $k=3$, determine the $(k-1)^{th}$ base difference according to a first base difference; or if $k \ge 4$, determine the $(k-1)^{th}$ base difference according to first to $(k-2)^{th}$ base differences.

With reference to the second possible implementation manner of the second aspect, in a third possible implementation manner of the second aspect, the second determining unit is configured to determine the first base difference $\bar{t}_{N-1}$ by using formula $\bar{t}_1=\lambda_1\cdot\theta_{(\rho_1)}$; and determine the $(k-1)^{th}$ base difference by using formula $\bar{t}_{k-1}=-\lambda_{k-1}T_{k-2}\tilde{u}_{k-2}+\lambda_{k-1}\theta_{(\rho_{k-1})}$, where $\lambda_1=\sqrt{1/\theta_{\rho_1,\rho_1}}$, $\theta_{(\rho_1)}$ is a $\rho_1^{th}$ column of $\Theta$, $\theta_{\rho_1,\rho_1}$ is an item in a $\rho_1^{th}$ row and a $\rho_1^{th}$ column in $\Theta$, $\Theta$ is a correlation matrix of the sensing matrix, $\rho_1$ is a sequence number of a column in the sensing matrix, where the column is a column of a first array most correlative to the measured value of the original signal in the sensing matrix, $T_1=[\bar{t}_1]$, $T_{k-2}=[T_{k-3}\ \bar{t}_{k-2}]$, $\lambda_{k-1}=1/\sqrt{\theta_{\rho_{k-1},\rho_{k-1}}-\tilde{u}_{k-2}{}^H\tilde{u}_{k-2}}$, $\tilde{u}_{k-2}=(\bar{t}_{(\rho,:)}{}^H)^H$, $\theta_{\rho_{k-1},\rho_{k-1}}$ is an item in a $\rho_{k-1}{}^{th}$ row and a $\rho_{k-1}{}^{th}$ column in $\Theta$, $\bar{t}_{(\rho_k,:)}{}^H$ is a $\rho_{k-1}{}^{th}$ row in $T_{k-2}$, and $\rho_{k-1}$ is a sequence number of a column in the sensing matrix, where the column is a column of a $(k-1)^{th}$ array most correlative to the measured value of the original signal in the sensing matrix.

With reference to the third possible implementation manner of the second aspect, in a fourth possible implementation manner of the second aspect, the second determining unit is further configured to determine the $k^{th}$ difference coefficient $\alpha_k$ by using formula $\alpha_k=\lambda_k q_{\rho_k}{}^{k-1}$.

With reference to the third or fourth possible implementation manner of the second aspect, in a fifth possible implementation manner of the second aspect, the method further includes a third determining unit configured to determine $F_1$ by using formula $F_1=[\lambda_1]$, and if $2 \leq k \leq K$, determine $F_k$ by using formula $$F_k = \begin{bmatrix} F_{k-1} & u_{k-1} \\ 0_{k-1}^T & \lambda_k \end{bmatrix},$$

where $u_{k-1}=-\lambda_k F_{k-1}\tilde{u}_{k-1}$; and the recovering unit is configured to recover the signal according to the $F_K$.

With reference to the fifth possible implementation manner of the second aspect, in a sixth possible implementation manner of the second aspect, the recovering unit is configured to determine a weight coefficient column vector $z_K$ by using formula $z_K=F_K a_K$; determine x according to the weight coefficient column vector to make $\hat{x}_{\tau_k}=z_k$ where $z_k$ is a $k^{th}$ item of $z_K$, and $\tau_k$ is a column in an array most correlative to the measured value of the original signal in the sensing matrix; and obtain the original signal according to the x.

With reference to the second possible implementation manner of the second aspect, in a seventh possible implementation manner of the second aspect, the second determining unit is configured to determine a first column and a second column of $\bar{T}_2$ as a first base difference; and determine a $(2k-3)^{th}$ column and a $(2k-2)^{th}$ column of $\bar{T}_{2k-2}$ as the $(k-1)^{th}$ base difference, where:
$\bar{T}_2=[\lambda_1\theta_{(\rho_1)}\ f_{1,2}\theta_{(\rho_1)}+\lambda_2\times\text{flipud}(\theta^*_{(\rho_1)})]$,
$\bar{T}_{2k-2}=[\bar{T}_{2k-4}\ \lambda_{2k-3}t_k\ (f_{2k-3,2k-2}t_{k-1}+\lambda_{2k-2}\times\text{flipud}(\tilde{t}^*_{k-1}))]$,
$\lambda_1\sqrt{1/\theta_{\rho_1,\rho_1}}$, $\theta_{\rho_1,\rho_1}$ represents an item in a $\rho_1{}^{th}$ row and a $\rho_1{}^{th}$ column in the sensing matrix $\Theta$, $\theta_{(\rho_1)}$ is the $\rho_1{}^{th}$ column in the sensing matrix $\Theta$, $f_{1,2}=-\lambda_2\lambda_1 u''_1$, $\lambda_2=1/\sqrt{\theta_{\rho_1,\rho_1}-(u''_1)^*u''_1}$, $u''_1=\lambda_1\times\theta_{\rho_1,N-\rho_1+1}$, $\theta_{\rho_1,N-\rho_1+1}$ represents an item in the $\rho_1{}^{th}$ row and a $(N-\rho_1+1)^{th}$ column in the sensing matrix $\Theta$, $q_{\rho_1,:}^H$ is the $\rho_1{}^{th}$ row in Q, Q is a matrix composed of correlations between the first residual error and the multiple columns in the sensing matrix, $\lambda_{2k-3}=1/\sqrt{\theta_{\rho_{k-1},\rho_{k-1}}-\tilde{u}'_{2k-4}{}^H\tilde{u}'_{2k-4}}$, $\tilde{u}'_{2k-4}=(T_{2k-4}(\bar{\rho}_{k-1},:))^H$, $T_{2k-4}(\bar{\rho}_{k-1},:)$ represents a $\bar{\rho}_{k-1}{}^{th}$ row in the matrix $T_{2k-4}$, $f_{2k-3,2k-2}=-\lambda_{2k-2}\lambda_{2k-3}\tilde{u}''_{2k-3}$, $\lambda_{2k-2}=1/\sqrt{1/\lambda_{2k-3}{}^2-|\tilde{u}''_{2k-3}|^2}$, $\tilde{u}''_{2k-3}=\lambda_{2k-3}(\theta_{\bar{\rho}_{k-1},\rho_{k-1}}-T_{2k-4}(\bar{\rho}_{k-1},:)\times\tilde{u}'_{2k-4})^*$, $t_{k-1}=\theta_{(\rho_{k-1})}-T_{2k-4}\tilde{u}'_{2k-4}$, and $\theta_{(\rho_{k-1})}$ is a $\rho_{k-1}{}^{th}$ column in the matrix $\Theta$.

With reference to the seventh possible implementation manner of the second aspect, in an eighth possible implementation manner of the second aspect, the second determining unit is further configured to determine a first row and a second row of $A_2$ as a first difference coefficient; and determine a $(2k-3)^{th}$ row and a $(2k-2)^{th}$ row of $A_{2k-2}$ as the $(k-1)^{th}$ difference coefficient, where:

$$A_{2k-2} = \begin{bmatrix} A_{(2k-4)} \\ \lambda_{2k-3}\tilde{a}_{2k-4,:}^H \\ (f_{2k-3,2k-2})^*\tilde{a}_{2k-4,:}^H + \lambda_{2k-2}(\tilde{a}_{2k-4,:}^H)^* \end{bmatrix},$$

and $$A_2 = \begin{bmatrix} \lambda_1 q_{\rho_1,:}^H \\ f_{1,2}^* q_{\rho_1,:}^H + \lambda_2 (q_{\rho_1,:}^H)^* \end{bmatrix}.$$

With reference to the seventh or eighth possible implementation manner of the second aspect, in a ninth possible implementation manner of the second aspect, the apparatus further includes a fourth unit configured to determine $F_{2k}$ by using formula $$F_2 = \begin{bmatrix} \lambda_1 & f_{1,2} \\ 0 & \lambda_2 \end{bmatrix},$$

and if $2 \leq k \leq K$, determine $F_{2k}$ by using formula $$F_{2k} = \begin{bmatrix} F_{2k-2} & -\lambda_{2k-1}w_{2k-2} & (-f_{2k-1,2k}w_{2k-2}-\lambda_{2k}\times\text{reorder}(w_{2k-2})) \\ 0_{2k-2}^H & \lambda_{2k-1} & f_{2k-1,2k} \\ 0_{2k-2}^H & 0 & \lambda_{2k} \end{bmatrix},$$

where reorder($w_{2k-2}$) refers to exchanging positions of a $(2i-1)^{th}$ item and a $2i^{th}$ item of a vector $w_{2k-2}$, and then calculating a conjugate of each item of the vector, where $i=1, 2, \ldots, k-1$, and $w_{2k-2}=F_{2k-2}\tilde{u}'_{2k-2}$; and the recovering unit is configured to recover the signal according to the $F_{2K}$.

In a third aspect, a signal reconstruction apparatus is provided, including a memory and a processor, where the memory stores program codes, and the processor is configured to invoke the program codes to perform the following operations: determining a correlation between a first residual error and multiple columns in a sensing matrix according to a measured value of an original signal and the sensing matrix, and determining a first array most correlative to the measured value of the original signal in the sensing matrix according to the correlation between the first residual error and the multiple columns in the sensing matrix; determining a correlation between a $k^{th}$ residual error and the multiple columns in the sensing matrix according to a correlation between a $(k-1)^{th}$ residual error and the multiple columns in the sensing matrix, and determining a $k^{th}$ array most correlative to the measured value of the original signal in the sensing matrix according to the correlation between the $k^{th}$ residual error and the multiple columns in the sensing matrix, where $2 \leq k \leq K$; and recovering the original signal after determining the $K^{th}$ array most correlative to the measured value of the original signal in the sensing matrix.

With reference to the third aspect, in a first possible implementation manner of the third aspect, the processor is configured to invoke the program codes to perform the following operations: from the correlation between the $(k-1)^{th}$ residual error and the multiple columns in the sensing matrix, subtracting a product of a $(k-1)^{th}$ base difference and a $(k-1)^{th}$ difference coefficient to obtain the correlation between the $k^{th}$ residual error and the multiple columns in the sensing matrix, where the $(k-1)^{th}$ base difference is a vector or a vector set, and the $(k-1)^{th}$ difference coefficient is a scalar or a scalar set or a set of vectors composed of multiple scalars.

With reference to the first possible implementation manner of the third aspect, in a second possible implementation manner of the third aspect, the processor is configured to invoke the program codes to perform the following operations: if k=2, determining a first base difference; if k=3, determining the $(k-1)^{th}$ base difference according to a first base difference; or if k≥4, determining the $(k-1)^{th}$ base difference according to first to $(k-2)^{th}$ base differences.

With reference to the second possible implementation manner of the third aspect, in a third possible implementation manner of the third aspect, the processor is configured to invoke the program codes to perform the following operations: determining the first base difference $\bar{t}_{N-1}$ by using formula $\bar{t}_1 = \lambda_1 \cdot \theta_{(\rho_1)}$; and determining the $(k-1)^{th}$ base difference by using formula $\bar{t}_{k-1} = -\lambda_{k-1} T_{k-2} \tilde{u}_{k-2} + \lambda_{k-1} \theta_{(\rho_{k-1})}$, where $\lambda_1 = \sqrt{1/\theta_{\rho_1,\rho_1}}$, $\theta_{(\rho_1)}$ is a $\rho_1^{th}$ column of $\Theta$, $\theta_{\rho_1,\rho_1}$ is an item in a $\rho_1^{th}$ row and a $\rho_1^{th}$ column in $\Theta$, $\Theta$ is a correlation matrix of the sensing matrix, $\rho_1$ is a sequence number of a column in the sensing matrix, where the column is a column of a first array most correlative to the measured value of the original signal in the sensing matrix, $T_1 = [\bar{t}_1]$, $T_{k-2} = [T_{k-3}\ \bar{t}_{k-2}]$, $\lambda_{k-1} = 1/\sqrt{\theta_{\rho_{k-1},\rho_{k-1}} - \tilde{u}_{k-2}^H \tilde{u}_{k-2}}$, $\tilde{u}_{k-2} = (\bar{t}_{(\rho,:)}^H)^H$, $\theta_{\rho_{k-1},\rho_{k-1}}$ is an item in a $\rho_{k-1}^{th}$ row and a $\rho_{k-1}^{th}$ column in $\Theta$, $\bar{t}_{(\rho_k,:)}^H$ is a $\rho_{k-1}^{th}$ row in $T_{k-2}$, and $\rho_{k-1}$ is a sequence number of a column in the sensing matrix, where the column is a column of a $(k-1)^{th}$ array most correlative to the measured value of the original signal in the sensing matrix.

With reference to the third possible implementation manner of the third aspect, in a fourth possible implementation manner of the third aspect, the processor is configured to invoke the program codes to perform the following operations: determining the $k^{th}$ difference coefficient $\alpha_k$ by using formula $\alpha_k = \lambda_k q_{\rho_k}^{k-1}$.

With reference to the third or fourth possible implementation manner of the third aspect, in a fifth possible implementation manner of the third aspect, the processor is configured to invoke the program codes to perform the following operations: determining $F_1$ by using formula $F_1 = [\lambda_1]$; if $2 \le k \le K$, determining $F_k$ by using formula $$F_k = \begin{bmatrix} F_{k-1} & u_{k-1} \\ 0_{k-1}^T & \lambda_k \end{bmatrix},$$

where $u_{k-1} = -\lambda_k F_{k-1} \tilde{u}_{k-1}$; and recovering the signal according to the $F_K$.

With reference to the fifth possible implementation manner of the third aspect, in a sixth possible implementation manner of the third aspect, the processor is configured to invoke the program codes to perform the following operations: determining a weight coefficient column vector $z_K$ by using formula $z_K = F_K a_K$; determining x according to the weight coefficient column vector to make $\hat{x}_{\tau_k} = z_k$, where $z_k$ is a $k^{th}$ item of $z_K$, and $\tau_k$ is a column in an array most correlative to the measured value of the original signal in the sensing matrix; and obtaining the original signal according to the x.

With reference to the second possible implementation manner of the third aspect, in a seventh possible implementation manner of the third aspect, the processor is configured to invoke the program codes to perform the following operations: determining a first column and a second column of $T_2$ as a first base difference; and determining a $(2k-3)^{th}$ column and a $(2k-2)^{th}$ column of $T_{2k-2}$ as the $(k-1)^{th}$ base difference, where $T_2 = [\lambda_1 \theta_{(\rho_1)}\ f_{1,2}\theta_{(\rho_1)} + \lambda_2 \times \text{flipud}(\theta^*_{(\rho_1)})]$,
$T_{2k-2} = [T_{2k-4}\lambda_{2k-3}t_k\ (f_{2k-3,2k-2}\bar{t}_{k-1} + \lambda_{2k-2} \times \text{flipud}(\tilde{t}^*_{k-1}))]$,
$\lambda_1 = \sqrt{1/\theta_{\rho_1,\rho_1}}$, $\theta_{\rho_1,\rho_1}$ represents an item in a $\rho_1^{th}$ row and a $\rho_1^{th}$ column in the sensing matrix $\Theta$, $\theta_{(\rho_1)}$ is the $\rho_1^{th}$ column in the sensing matrix $\Theta$, $f_{1,2} = -\lambda_2 \lambda_1 u''_1$, $\lambda_2 = 1/\sqrt{\theta_{\rho_1,\rho_1} - (u''_1)^* u''_1}$, $u''_1 = \lambda_1 \times \theta_{\rho_1,N-\rho_1+1}$, $\theta_{\rho_1,N-\rho_1+1}$ represents an item in the $\rho_1^{th}$ row and a $(N-\rho_1+1)^{th}$ column in the sensing matrix $\Theta$, $q_{\rho_1,:}^H$ is the $\rho_1^{th}$ row in Q, Q is a matrix composed of correlations between the first residual error and the multiple columns in the sensing matrix, $\lambda_{2k-3} = 1/\sqrt{\theta_{\rho_{k-1},\rho_{k-1}} - \tilde{u}'^H_{2k-4}\tilde{u}'_{2k-4}}$, $\tilde{u}'_{2k-4} = (T_{2k-4}(\bar{\rho}_{k-1},:))^H$, $T_{2k-4}(\bar{\rho}_{k-1},:)$ represents a $\bar{\rho}_{k-1}^{th}$ row in the matrix $T_{2k-4}$, $f_{2k-3,2k-2} = -\lambda_{2k-2}\lambda_{2k-3}\tilde{u}''_{2k-3}$, $\lambda_{2k-2} = 1/\sqrt{1/\lambda_{2k-3}^2 - |\tilde{u}''_{2k-3}|^2}$, $\tilde{u}''_{2k-3} = \lambda_{2k-3}(\theta_{\bar{\rho}_{k-1},\rho_{k-1}} - T_{2k-4}(\bar{\rho}_{k-1},:)\times\tilde{u}'_{2k-4})^*$, $\bar{t}_{k-1} = \theta_{(\rho_{k-1})} - T_{2k-4}\tilde{u}'_{2k-4}$, and $\theta_{(\rho_{k-1})}$ is a $\rho_{k-1}^{th}$ column in the matrix $\Theta$.

With reference to the seventh possible implementation manner of the third aspect, in an eighth possible implementation manner of the third aspect, the processor is configured to invoke the program codes to perform the following operations: determining a first row and a second row of $A_2$ as a first difference coefficient; and determining a $(2k-3)^{th}$ row and a $(2k-2)^{th}$ row of $A_{2k-2}$ as the $(k-1)^{th}$ difference coefficient, where:

$$A_{2k-2} = \begin{bmatrix} A_{(2k-4)} \\ \lambda_{2k-3}\tilde{a}^H_{2k-4,:} \\ (f_{2k-3,2k-2})^* \tilde{a}^H_{2k-4,:} + \lambda_{2k-2}(\tilde{a}^H_{2k-4,:})^* \end{bmatrix},$$

and $$A_2 = \begin{bmatrix} \lambda_1 q^H_{\rho_1,:} \\ f^*_{1,2} q^H_{\rho_1,:} + \lambda_2 (q^H_{\rho_1,:})^* \end{bmatrix}.$$

With reference to the seventh or eighth possible implementation manner of the third aspect, in a ninth possible implementation manner of the third aspect, the processor is configured to invoke the program codes to perform the following operations: determining $F_2$ by using formula $$F_2 = \begin{bmatrix} \lambda_1 & f_{1,2} \\ 0 & \lambda_2 \end{bmatrix};$$

if $2 \le k \le K$, determining $F_{2k}$ by using formula $$F_{2k} = \begin{bmatrix} F_{2k-2} & -\lambda_{2k-1}w_{2k-2} & (-f_{2k-1,2k}w_{2k-2} - \lambda_{2k}\times\text{reorder}(w_{2k-2})) \\ 0^H_{2k-2} & \lambda_{2k-1} & f_{2k-1,2k} \\ 0^H_{2k-2} & 0 & \lambda_{2k} \end{bmatrix},$$

where reorder($w_{2k-2}$) refers to exchanging positions of a $(2i-1)^{th}$ item and a $2i^{th}$ item of a vector $w_{2k-2}$, and then calculating a conjugate of each item of the vector, where i=1, 2, ..., k-1, and $w_{2k-2} = F_{2k-2}\tilde{u}'_{2k-2}$; and recovering the signal according to the $F_{2K}$.

Based on the foregoing technical solutions, in the signal reconstruction method and apparatus that are provided in the embodiments of the present invention, a correlation between a first residual error and multiple columns in a sensing matrix is determined according to a measured value of an original signal and the sensing matrix; a first array most correlative to the measured value of the original signal in the sensing matrix is determined according to the correlation between the first residual error and the multiple columns in the sensing matrix; a correlation between a $k^{th}$ residual error and the multiple columns in the sensing matrix is determined according to a correlation between a $(k-1)^{th}$ residual error and the multiple columns in the sensing matrix, and a $k^{th}$ array most correlative to the measured value of the original signal in the sensing matrix is determined according to the correlation between the $k^{th}$ residual error and the multiple columns in the sensing matrix, where $2 \leq k \leq K$; and the original signal is recovered after the $K^{th}$ array most correlative to the measured value of the original signal in the sensing matrix is determined. In this way, under the premise of ensuring proper recovery of the signal, the amount of calculation for reconstructing the signal can be reduced.

BRIEF DESCRIPTION OF THE DRAWINGS

To illustrate the technical solutions in the embodiments of the present invention more clearly, the following briefly introduces the accompanying drawings required for describing the embodiments or the prior art. The accompanying drawings in the following description show merely some embodiments of the present invention, and a person of ordinary skill in the art may still derive other drawings from these accompanying drawings without creative efforts.

DETAILED DESCRIPTION

The following clearly and completely describes the technical solutions in the embodiments of the present invention with reference to the accompanying drawings in the embodiments of the present invention. The described embodiments are merely a part rather than all of the embodiments of the present invention. All other embodiments obtained by a person of ordinary skill in the art based on the embodiments of the present invention without creative efforts shall fall within the protection scope of the present invention.

The technical solutions of the present invention are applicable to various communication systems, such as Global System for Mobile Communications (GSM), code division multiple access (CDMA) system, wideband code division multiple access wireless (WCDMA), general packet radio service (GPRS), long term evolution (LTE), and the like.

Figure 1:
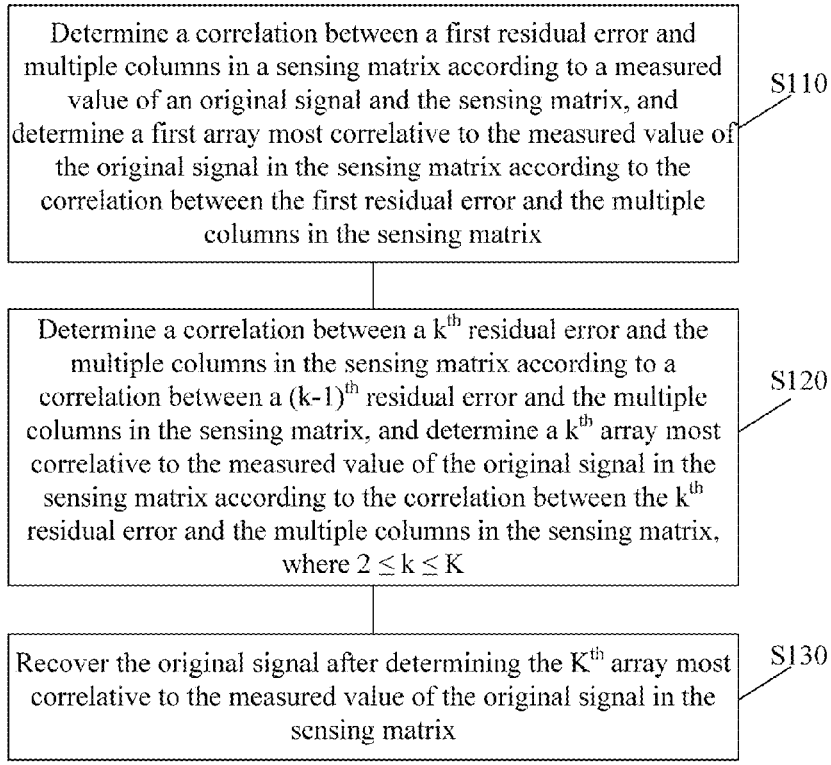
FIG. 1 is a schematic flowchart of a signal reconstruction method according to an embodiment of the present invention.

FIG. 1 is a schematic flowchart of a signal reconstruction method 100 according to an embodiment of the present invention. As shown in FIG. 1, the method 100 includes the following steps.

S110. Determine a correlation between a first residual error and multiple columns in a sensing matrix according to a measured value of an original signal and the sensing matrix, and determine a first array most correlative to the measured value of the original signal in the sensing matrix according to the correlation between the first residual error and the multiple columns in the sensing matrix.

S120. Determine a correlation between a $k^{th}$ residual error and the multiple columns in the sensing matrix according to a correlation between a $(k-1)^{th}$ residual error and the multiple columns in the sensing matrix, and determine a $k^{th}$ array most correlative to the measured value of the original signal in the sensing matrix according to the correlation between the $k^{th}$ residual error and the multiple columns in the sensing matrix, where $2 \leq k \leq K$.

S130. Recover the original signal after determining the $K^{th}$ array most correlative to the measured value of the original signal in the sensing matrix.

In the embodiment of the present invention, in S120, the determining a correlation between a $k^{th}$ residual error and the multiple columns in the sensing matrix according to a correlation between a $(k-1)^{th}$ residual error and the multiple columns in the sensing matrix includes, from the correlation between the $(k-1)^{th}$ residual error and the multiple columns in the sensing matrix, subtracting a product of a $(k-1)^{th}$ base difference and a $(k-1)^{th}$ difference coefficient to obtain the correlation between the $k^{th}$ residual error and the multiple columns in the sensing matrix, where the $k^{th}$ base difference is a vector or a vector set, and the $(k-1)^{th}$ difference coefficient is a scalar or a scalar set or a set of vectors composed of multiple scalars.

In the embodiment of the present invention, before the from the correlation between the $(k-1)^{th}$ residual error and the multiple columns in the sensing matrix, subtracting a product of a $(k-1)^{th}$ base difference and a $(k-1)^{th}$ difference coefficient to obtain the correlation between the $k^{th}$ residual error and the multiple columns in the sensing matrix, the determining a correlation between a $k^{th}$ residual error and the multiple columns in the sensing matrix in S120 further includes: if $k=2$, determining a first base difference; if $k=3$, determining the $(k-1)^{th}$ base difference according to a first base difference; or if $k \geq 4$, determining the $(k-1)^{th}$ base difference according to first to $(k-2)^{th}$ base differences.

Therefore, in the embodiment of the present invention, the correlation between the $k^{th}$ residual error and the multiple columns in the sensing matrix is determined according to the correlation between the $(k-1)^{th}$ residual error and the multiple columns in the sensing matrix, and a column most correlative to the measured value of the original signal in the sensing matrix is further determined for recovering the signal. In this way, under the premise of ensuring proper recovery of the signal, the amount of calculation for reconstructing the signal can be reduced.

To enable clearer understanding of the present invention, the following describes in detail the signal reconstruction method in the embodiments of the present invention with reference to FIG. 2 to FIG. 7.

Figure 2:
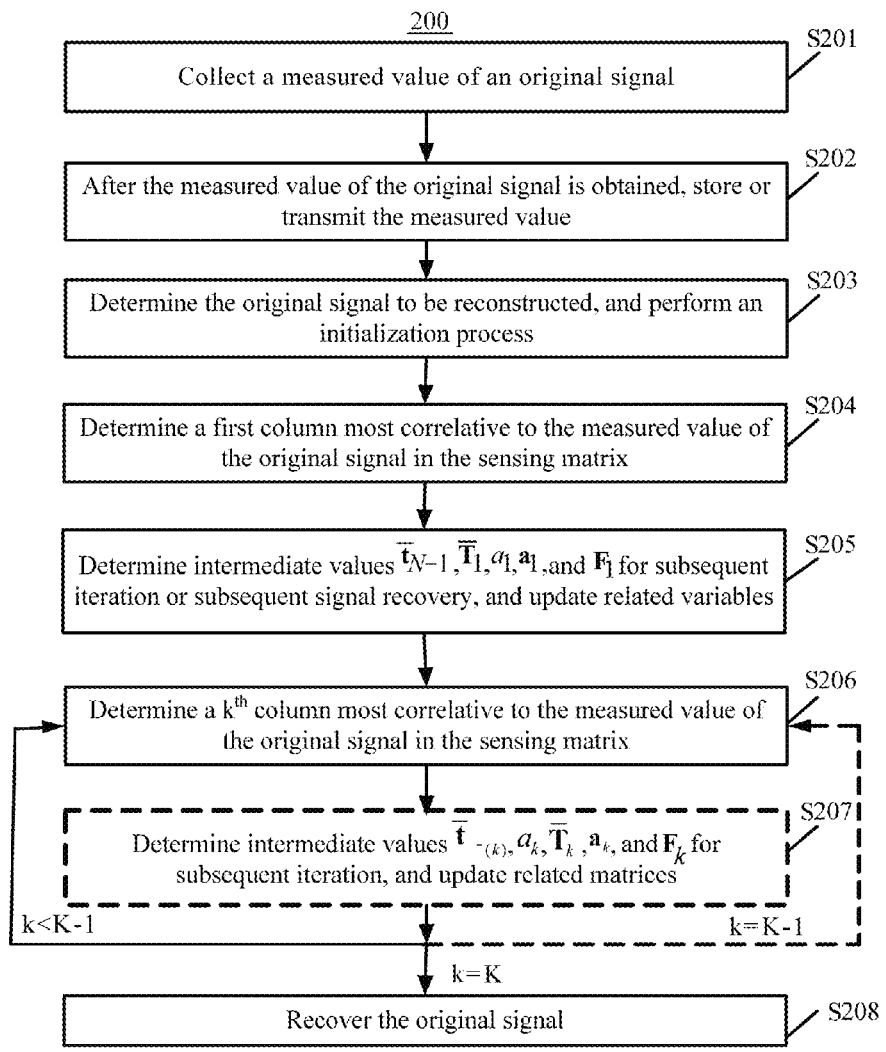
FIG. 2 is a schematic flowchart of a signal reconstruction method according to another embodiment of the present invention.

FIG. 2 is a schematic flowchart of a signal reconstruction method 200 according to an embodiment of the present invention. As shown in FIG. 2, the method 200 includes:

S201. Collect a measured value (non-adaptive linear projection) of an original signal, where the measured value may be represented by equation (2.1):

$$y=\Phi s \qquad (2.1)$$

In the above equation, y is a measured value vector, $\Phi$ is a measurement matrix, and S is the original signal.

S202. After the measured value of the original signal is obtained, store or transmit the measured value.

S203. Determine the original signal to be reconstructed. First, perform an initialization process, where the initialization process may include the following steps.

(1) Set an initial value $\hat{y}=y$ of a residual error, that is, set the initial value of the residual error to be a measured value vector.

(2) Set an initial value of an estimated value of sparse expression x to $\hat{x}=0_N$.

(3) Set a sensing matrix $T=\Phi\Psi^H$, where the sensing matrix is an N×N matrix; and denote the modulus of columns in the sensing matrix T as $\delta_{\square-(0)}=[\|t_{(1)}\|_2 \|t_{(2)}\|_2 \ldots \|t_{(N)}\|_2]$, where $t_{(i)}$ (i=1, 2, ..., N) represents the $i^{th}$ column of T, and $\|t_{(i)}\|_2$ represents the modulus of the vector $t_{(i)}$.

$\pi_{\square-(0)}$ is set, where $\pi_{\square-(0)}=[1\ 2\ \ldots\ N]^T$ records a sequence number of each column of the sensing matrix, and is an initial value of an atom sequence number set to be selected. In subsequent $k^{th}$ (k=1, 2, ..., N) iteration, after an atom is selected into a base matrix, a sequence number of the atom is deleted from a vector $\pi_{\square-(k-1)}$ correspondingly. An index of a selected column of the base matrix B is denoted as a column vector $\tau$, and its initial value $\tau_0$ is an empty vector.

(4) Calculate and store a correlation matrix $\Theta=T^H T$ of the sensing matrix, or calculate and store off-diagonal items (that is, items that are not on the diagonal) of a correlation matrix $\Theta=T^H T$ of the sensing matrix. It should be noted that, because the sensing matrix T is generally constant, or at least constant in a long time, it is not necessary to calculate the correlation matrix $\Theta=T^H T$ of the sensing matrix on every occasion of reconstructing the original signal. After the correlation matrix $\Theta=T^H T$ of the sensing matrix is calculated and stored, the stored correlation matrix $\Theta=T^H T$ is reusable in subsequent reconstruction of the original signal and the correlation matrix does not need to be calculated again.

S204. Determine a first column most correlative to the measured value of the original signal in the sensing matrix, which may include the following steps.

(1) Calculate a correlation between a first residual error and each column in the sensing matrix by using formula (2.2):

$$q_N = T_N^H \hat{y} = T_N^H y \qquad (2.2)$$

The first residual error is the initial value of the residual error, and is equal to the measured value vector. Meanwhile, the correlation between the first residual error and each column in the sensing matrix $T_N$ is recorded by using $\tilde{q}_N=q_N$.

(2) Find a sequence number $\rho_1$ of a column with the maximum correlation value by using formula (2.3):

$$\rho_1 = \underset{i=1}{\overset{\square^-(k-1)}{\operatorname{argmax}}} q_i/\delta_i \qquad (2.3)$$

Therefore, it can be determined that the $\rho_1^{th}$ column in the sensing matrix is the first column most correlative to the measured value of the original signal in the sensing matrix.

S205. Determine intermediate values $\bar{t}_{N-1}$, $\overline{T}_1$, $\alpha_1$, $a_1$, and $F_1$ for subsequent iteration or subsequent signal recovery, and update related variables.

First, an intermediate parameter $\lambda_1$ is calculated by using formula (2.4):

$$\lambda_1 = \sqrt{1/\theta_{\rho_1,\rho_1}} \qquad (2.4),$$

where, $\theta_{\rho_1,\rho_1}$ is an item in a $\rho_1^{th}$ row and a $\rho_1^{th}$ column of $\Theta_{\square-(0)}$.

Then, intermediate parameters $\bar{t}_{N-1}$ (that is, a first base difference) and $\alpha_1$ (that is, a first difference coefficient) are calculated respectively for subsequent iteration by using formulas (2.5) and (2.6):

$$\bar{t}_{N-1} = \lambda_1 \cdot \theta_{(\rho_1)} \qquad (2.5)$$

$$\alpha_1 = \lambda_1 \tilde{q}_{\rho_1} \qquad (2.6)$$

In the above formulas, $\theta_{(\rho_1)}$ is obtained by deleting the $\rho_1^{th}$ item $\theta_{\rho_1,\rho_1}$ in the $\rho_1^{th}$ column $\theta_{(\rho_1)}$ of $\Theta_{\square-(0)}$, and $\tilde{q}_{\rho_1}$ is the $\rho_1^{th}$ item of $\tilde{q}_N$.

(3) Calculate parameters $\overline{T}_1$ and $a_1$ for subsequent iteration by using the following formulas (2.7) and (2.8):

$$\overline{T}_1 = [\bar{t}_{N-1}] \qquad (2.7)$$

$$a_1 = [\alpha_1] \qquad (2.8)$$

(4) Calculate a parameter $F_1$ for subsequent iteration by using the following formula (2.9):

$$F_1 = [\lambda_1] \qquad (2.9)$$

(5) According to $\tau_{k-1}$, obtain an index $\tau_k$ of each column of the base matrix $B_k$; and according to an index $\pi_{\square-(k-1)}$ of each column of $T_{\square-(k-1)}$ and the modulus $\delta_{\square-(k-1)}$ of each column, obtain an index $\pi_{\square-(k)}$ of each column of $T_{\square-(k)}$ and the modulus $\delta_{\square-(k)}$ of each column respectively.

$\tau_k = [\tau_{k-1}^T\ \pi_{\rho_k}]^T$ is obtained, where $\pi_{\rho_k}$ is the $\rho_k^{th}$ item in $\pi_{\square-(k-1)}$; the $\rho_k^{th}$ item $\pi_{\rho_k}$ is deleted from $\pi_{\square-(k-1)}$ to obtain $\pi_{\square-(k)}$ for subsequent iteration; and the $\rho_k^{th}$ item is deleted from $\delta_{\square-(k-1)}$ to obtain $\delta_{\square-(k)}$ for subsequent iteration. It should be noted that, the current k is equal to 1.

(6) Update $\tilde{q}_{\square-(0)}$, $q_{\square-(0)}$, and $\Theta_{\square-(0)}$ to $\tilde{q}_{\square-(1)}$, $q_{\square-(0)}$, and $\Theta_{\square-(1)}$ respectively, that is, delete the $\rho_1^{th}$ item $\tilde{q}_{\rho_1}$ from $\tilde{q}_{\square-(0)}$ to obtain $\tilde{q}_{\square-(1)}$; delete the $\rho_1^{th}$ item from $q_{\square-(0)}$ to obtain $q_{\square-(1)}$; and delete the $\rho_1^{th}$ row and the $\rho_1^{th}$ column from $\Theta_{\square-(0)}$ to obtain $\Theta_{\square-(1)}$.

S206. Determine a $k^{th}$ column most correlative to the measured value of the original signal in the sensing matrix, where an initial value of k is 2, which may include the following steps.

(1) Calculate, by using formula (2.10), a correlation $q_{\square-(k-1)}$ between a $k^{th}$ residual error and each column in $T_{\square-(k-1)}$ (that is, $\square-(k-1)$ columns to be selected in the sensing matrix T), that is:

$$q_{\square-(k-1)} = \tilde{q}_{\square-(k-2)} - \bar{t}_{\square-(k-1)}\alpha_{k-1} \qquad (2.10)$$

In the above formula, the vector $\bar{t}_{\square-(k-1)}$ is a $(k-1)^{th}$ base difference, and the scalar $\alpha_{k-1}$ is a $(k-1)^{th}$ difference coefficient, which have been obtained in preceding steps.

(2) Determine a sequence number $\rho_k$ of a column with the maximum correlation value by using formula (2.11):

$$\rho_k = \underset{i=1}{\overset{\square^-(k-1)}{\operatorname{argmax}}} q_i/\delta_i \qquad (2.11)$$

In the above formula, $q_i$ is an $i^{th}$ item of $q_{\square-(k-1)}$, and $\delta_i$ is an $i^{th}$ item of $\delta_{\square-(k-1)}$.

Therefore, it can be determined that, among columns of $T_{\square_{-(k-1)}}$ (that is, the $\square_{-(k-1)}$ column to be selected in the sensing matrix, and in other words, the sensing matrix cleared of k−1 columns selected into the base matrix), the $\rho_k^{th}$ column is a column most correlative to the measured value of the original signal in $T_{\square_{-(k-1)}}$.

S207. Determine intermediate values $\bar{t}_{\square_{-(k)}}$, $\alpha_k$, $T_k$, $a_k$, and $F_k$ for subsequent iteration or subsequent signal recovery, and update related variables.

(1) From the previously calculated $T_{k-1}$, obtain the $\rho_k^{th}$ row $\bar{t}_{(\rho_k,:)}{}^H$ to make $\tilde{u}_{k-1}=(\bar{t}_{(\rho_k,:)}{}^H)^H$; and then, from $\Theta_{\square_{-(k-1)}}$, obtain an item $\theta_{\rho_k,\rho_k}$ in the $\rho_k^{th}$ row and the $\rho_k^{th}$ column, so as to determine $\lambda_k$ by using the following formula (2.12):

$$\lambda_k = 1/\sqrt{\theta_{\rho_k,\rho_k} - \tilde{u}_{k-1}{}^H \tilde{u}_{k-1}} \quad (2.12)$$

(2) Calculate intermediate values $\bar{t}_{\square_{-(k)}}$ (that is, a $k^{th}$ base difference) and $\alpha_k$ (that is, a $k^{th}$ difference coefficient) for subsequent iteration by using the following formulas (2.13) and (2.14):

$$\bar{t}_{\square_{-(k)}} = -\lambda_k \bar{F}_{k-1} \tilde{u}_{k-1} + \lambda_k \Theta_{(\rho_k)} \quad (2.13)$$

$$\alpha_k = \lambda_k (\tilde{q}_{\rho_k} - \tilde{u}_{k-1}{}^H a_{k-1}) \quad (2.14)$$

In the above formulas, $\bar{F}_{k-1}$ is obtained by deleting the $\rho_k^{th}$ row $\bar{t}_{(\rho_k,:)}{}^H$ from $T_{k-1}$, $\Theta_{(\rho_k)}$ is obtained by deleting the $\rho_k^{th}$ item $\theta_{\rho_k,\rho_k}$ from the $\rho_k^{th}$ column $\theta_{(\rho_k)}$ of $\Theta_{\square_{-(k-1)}}$, and $\tilde{q}_{\rho_k}$ is the $\rho_k^{th}$ item of $\tilde{q}_{\square_{-(k-1)}}$. In addition, $a_k$ may be calculated by using $a_k = \lambda_k q_{\rho_k}^{\square_{-(k-1)}}$, where $q_{\rho_k}^{\square_{-(k-1)}}$ is the $\rho_k^{th}$ item of $q_{\square_{-(k-1)}}$.

(3) Obtain intermediate parameters $T_k$ and $a_k$ for subsequent iteration by using the following formulas (2.15) and (2.16):

$$T_k = [\bar{F}_{k-1} \ \bar{t}_{\square_{-(k)}}] \quad (2.15)$$

$$a_k = [a_{k-1}^T \ \alpha_k]^T \quad (2.16)$$

(4) First, calculate $u_{k-1}$ by using formula $u_{k-1} = -\lambda_k F_{k-1} \tilde{u}_{k-1}$, and then calculate a parameter $F_k$ for subsequent iteration by using the following formula (2.17):

$$F_k = \begin{bmatrix} F_{k-1} & u_{k-1} \\ 0_{k-1}^T & \lambda_k \end{bmatrix} \quad (2.17)$$

It can be easily seen that, $u_{k-1}$ and $F_k$ are not used in iterations until in recovering the original signal (that is, in S208). Therefore, it is not necessary to calculate $u_{k-1}$ and $F_k$ in every iteration, thereby reducing the amount of calculation in each iteration and improving the speed of each iteration. $F_k$ may also be calculated by other methods.

(5) According to $\tau_{k-1}$, obtain an index $\tau_k$ of each column of the base matrix $B_k$; and according to an index $\pi_{\square_{-(k-1)}}$ of each column of $T_{\square_{-(k-1)}}$ and the modulus $\delta_{\square_{-(k-1)}}$ of each column, obtain an index $\pi_{\square_{-(k)}}$ of each column of $T_{\square_{-(k)}}$ and the modulus $\delta_{\square_{-(k)}}$ of each column respectively.

$\tau_k = [\tau_{k-1}^T \ \pi_{\rho_k}]^T$ is obtained, where $\pi_{\rho_k}$ is the $\rho_k^{th}$ item in $\pi_{\square_{-(k-1)}}$; the $\rho_k^{th}$ item $\pi_{\rho_k}$ is deleted from $\pi_{\square_{-(k-1)}}$ to obtain $\pi_{\square_{-(k)}}$ for subsequent iteration; and the $\rho_k^{th}$ item is deleted from $\delta_{\square_{-(k-1)}}$ to obtain $\delta_{\square_{-(k)}}$ for subsequent iteration.

(6) Update $\tilde{q}_{\square_{-(k-1)}}$, $q_{\square_{-(k-1)}}$, and $\Theta_{\square_{-(k-1)}}$ to $\tilde{q}_{\square_{-(k)}}$, $q_{\square_{-(k)}}$, and $\Theta_{\square_{-(k)}}$ respectively, that is, delete the $\rho_k^{th}$ item $\tilde{q}_{\rho_k}$ from $\tilde{q}_{\square_{-(k-1)}}$ to obtain $\tilde{q}_{\square_{-(k)}}$ for subsequent iteration; delete the $\rho_k^{th}$ item from $q_{\square_{-(k-1)}}$ to obtain $q_{\square_{-(k)}}$ for subsequent iteration; and delete the $\rho_k^{th}$ row and the $\rho_k^{th}$ column from $\Theta_{\square_{-(k-1)}}$ to obtain $\Theta_{\square_{-(k)}}$ for subsequent iteration.

(7) If k<K−1, the process goes back to S206 and S207 after the value of k increases by 1; if k=K−1, the process goes back to S206 and S207 after the value of k increases by 1, and subsequently S208 is performed. When S207 is performed, it is necessary only to calculate $\alpha_K$, $a_K$, and $F_K$ for subsequent signal recovery.

S208. Recover the original signal, mainly including the following steps.

(1) Calculate, by using the following formula (2.18), a column vector $z_K$ composed of weight coefficients of K columns selected in the base matrix B:

$$z_K = F_K a_K \quad (2.18)$$

(2) The initial value of the estimated value of x is $\hat{x}=0_N$. In $\hat{x}$, let the $\tau_k^{th}$ item be $\hat{x}_{\tau_k} = z_k$ (k=1, 2, ..., K), where $z_k$ is the $k^{th}$ item of $z_K$, and $\tau_k$ is the $k^{th}$ item of the vector $\tau_K$.

(3) Determine the original signal by using the following formula (2.19):

$$\hat{s} = \omega^H \hat{x} \quad (2.19)$$

The original signal $\hat{s}$ is therefore obtained.

Figure 3:
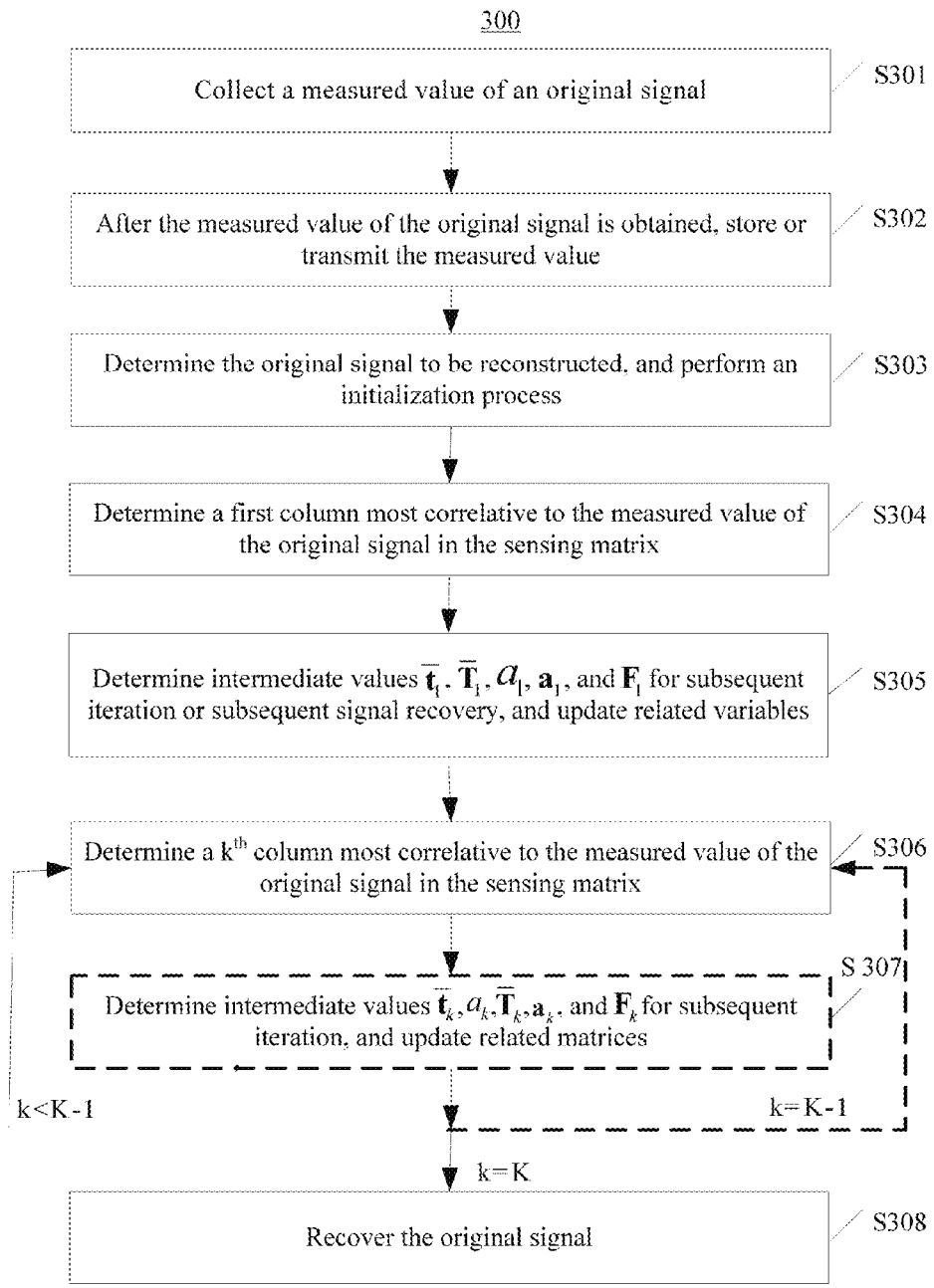
FIG. 3 is a schematic flowchart of a signal reconstruction method according to another embodiment of the present invention.

FIG. 3 is a schematic flowchart of a signal reconstruction method 300 according to an embodiment of the present invention. As shown in FIG. 3, the method 300 includes the following steps.

S301. Collect a measured value (non-adaptive linear projection) of an original signal, where the measured value may be represented by equation (3.1):

$$y = \Phi s \quad (3.1)$$

In the above equation, y is a measured value vector, $\Phi$ is a measurement matrix, and s is the original signal.

S302. After the measured value of the original signal is obtained, store or transmit the measured value.

S303. Determine the original signal to be reconstructed. First, perform an initialization process, where the initialization process may include the following steps:

(1) Set an initial value $\hat{y}=y$ of a residual error, that is, set the initial value of the residual error to be a measured value vector.

(2) Set an initial value of an estimated value of sparse expression x to $\hat{x}=0_N$.

(3) Set a sensing matrix $T=\Phi\Psi^H$, where the sensing matrix is an N×N matrix; and denote the modulus of columns in the sensing matrix T as $\delta=[\|t_{(1)}\|_2 \|t_{(2)}\|_2 \ldots \|t_{(N)}\|_2]$, where $t_{(i)}$ (i=1, 2, ..., N) represents the $i^{th}$ column of T, and $\|t_{(i)}\|_2$ represents the modulus of the vector $t_{(i)}$.

An index of a selected column of the base matrix B is denoted as a column vector $\tau$, and its initial value $\tau_0$ is an empty vector.

(4) Calculate and store a correlation matrix $\Theta = T^H T$ of the sensing matrix, or calculate and store off-diagonal items (that is, items that are not on the diagonal) of a correlation matrix $\Theta = T^H T$ of the sensing matrix. It should be noted that, because the sensing matrix T is generally constant, or at least constant in a long time, it is not necessary to calculate the correlation matrix $\Theta = T^H T$ of the sensing matrix on every occasion of reconstructing the original signal. After the correlation matrix $\Theta = T^H T$ of the sensing matrix is calculated and stored, the stored correlation matrix $\Theta = T^H T$ is reusable in subsequent reconstruction of the original signal and the correlation matrix does not need to be calculated again.

S304. Determine a first column most correlative to the measured value of the original signal in the sensing matrix, which may include the following steps:

(1) Calculate a correlation between a first residual error and each column in the sensing matrix by using formula (3.2):

$$q^0 = T_N^H \hat{y} = T_N^H y \quad (3.2)$$

The first residual error is the initial value of the residual error, and is equal to the measured value vector.

(2) Find a sequence number $\rho_1$ of a column with the maximum correlation value by using formula (3.3):

$$\rho_1 = \underset{i=1}{\overset{N}{\operatorname{argmax}}} q_i^0 / \delta_i, \qquad (3.3)$$

where, $q_i^0$ is an $i^{th}$ item of $q^0$. Therefore, it can be determined that the $\rho_1^{th}$ column in the sensing matrix is the first column most correlative to the measured value of the original signal in the sensing matrix.

S305. Determine intermediate values $\bar{t}_1$, $\overline{T}_1$, $\alpha_1$, $a_1$, and $F_1$ for subsequent iteration or subsequent signal recovery, and update related variables, including the following steps.

(1) Calculate an intermediate parameter $\lambda_1$ by using formula (3.4):

$$\lambda_1 = \sqrt{1/\theta_{\rho_1,\rho_1}} \qquad (3.4),$$

where, $\theta_{\rho_1,\rho_1}$ is an item in a $\rho_1^{th}$ row and a $\rho_1^{th}$ column of $\Theta$.

(2) Calculate intermediate parameters $\bar{t}_1$ (that is, a first base difference) and $\alpha_1$ (that is, a first difference coefficient) respectively for subsequent iteration by using formulas (3.5) and (3.6):

$$\bar{t}_1 = \lambda_1 \cdot \theta_{(\rho_1)} \qquad (3.5),$$

$$\alpha_1 = \lambda_1 \tilde{q}_{\rho_1} \qquad (3.6),$$

where, $\theta_{(\rho_1)}$ is the $\rho_1^{th}$ column of $\Theta$, and $\tilde{q}_{\rho_1}$ is a $\rho_1^{th}$ item of $\tilde{q}_N$.

(3) Calculate parameters $\overline{T}_1$ and $a_1$ for subsequent iteration by using the following formulas (3.7) and (3.8):

$$\overline{T}_1 = [\bar{t}_1] \qquad (3.7)$$

$$a_1 = [\alpha_1] \qquad (3.8)$$

(4) Calculate a parameter $F_1$ for subsequent iteration by using the following formula (3.9):

$$F_1 = [\lambda_1] \qquad (3.9)$$

(5) According to $\tau_{k-1}$, obtain an index $\tau_k$ of each column of the base matrix $B_k$.

$\tau_k = [\tau_{k-1}^T \rho_k]^T$ is therefore obtained. It should be noted that, the current k is equal to 1.

S306. Determine a $k^{th}$ column most correlative to the measured value of the original signal in the sensing matrix, where an initial value of k is 2, which may include the following steps.

(1) Calculate a correlation $q^{k-1}$ between a $k^{th}$ residual error and each column in the sensing matrix T by using formula (3.10):

$$q^{k-1} = q^{k-2} - \bar{t}_{k-1} \alpha_{k-1} \qquad (3.10)$$

In the above formula, the vector $\bar{t}_{k-1}$ is a $(k-1)^{th}$ base difference, and the scalar $\alpha_{k-1}$ is a $(k-1)^{th}$ difference coefficient, which have been obtained in preceding steps.

(2) Determine a sequence number $\rho_k$ of a column with the maximum correlation value by using formula (3.11):

$$\rho_k = \underset{i=1}{\overset{N}{\operatorname{argmax}}} |q_i^{k-1}| / \delta_i, \qquad (3.11)$$

where, $q_i^{k-1}$ is an $i^{th}$ item of $q^{k-1}$, and $\delta_i$ is an $i^{th}$ item of $\delta$.

Therefore, it can be determined that, among columns of T, the $\rho_k^{th}$ column is a column most correlative to the measured value vector of the original signal in T.

S307. Determine intermediate values $\bar{t}_k$, $\alpha_k$, $\overline{T}_k$, $a_k$, and $F_k$ for subsequent iteration or subsequent signal recovery, and update related variables.

(1) From the previously calculated $\overline{T}_{k-1}$, obtain the $\rho_k^{th}$ row $\bar{t}_{(\rho_k:)}^H$ to make $\tilde{u}_{k-1} = (\bar{t}_{(\rho_k:)}^H)^H$; and then, from $\Theta$, obtain an item $\theta_{\rho_k,\rho_k}$ in the $\rho_k^{th}$ row and the $\rho_k^{th}$ column, so as to determine $\lambda_k$ by using the following formula (3.12):

$$\lambda_k = 1/\sqrt{\theta_{\rho_k,\rho_k} - \tilde{u}_{k-1}^H \tilde{u}_{k-1}} \qquad (3.12)$$

(2) Calculate intermediate values $\bar{t}_k$ (that is, a $k^{th}$ base difference) and $\alpha_k$ (that is, a $k^{th}$ difference coefficient) for subsequent iteration by using the following formulas (3.13) and (3.14):

$$\bar{t}_k = -\lambda_k \overline{T}_{k-1} \tilde{u}_{k-1} + \lambda \theta_{(\rho_k)} \qquad (3.13),$$

$$\alpha_k = \lambda_k q_{\rho_k}^{k-1} \qquad (3.14),$$

where, $\overline{T}_{k-1}$ is obtained in the previous iteration, $\theta_{(\rho_k)}$ is the $\rho_k^{th}$ column of $\Theta$, and $q_{\rho_k}^{k-1}$ is the $\rho_k^{th}$ item of $q^{k-1}$.

(3) Obtain intermediate parameters $\overline{T}_k$ and $a_k$ for subsequent iteration by using the following formulas (3.15) and (3.16):

$$\overline{T}_k = [\overline{T}_{k-1} \bar{t}_k] \qquad (3.15)$$

$$a_k [a_{k-1}^T \alpha_k]^T \qquad (3.16)$$

(4) According to $\tau_{k-1}$, obtain an index $\tau_k = [\tau_{k-1}^T \rho_k]^T$ of each column of the base matrix $B_k$.

(5) First, calculate $u_{k-1}$ by using formula $u_{k-1} = -\lambda_k F_{k-1} \tilde{u}_{k-1}$ and then calculate a parameter $F_k$ for subsequent iteration by using the following formula (3.17):

$$F_k = \begin{bmatrix} F_{k-1} & u_{k-1} \\ 0_{k-1}^T & \lambda_k \end{bmatrix} \qquad (3.17)$$

It can be easily seen that, $u_{k-1}$ and $F_k$ are not used in iterations until in recovering the original signal (that is, in S208). Therefore, it is not necessary to calculate $u_{k-1}$ and $F_k$ in every iteration, thereby reducing the amount of calculation in each iteration and improving the speed of each iteration. $F_k$ may also be calculated by other methods than the method disclosed in the present invention.

It should be understood that, if k<K−1 (generally, K is smaller than or equal to K_sparse), the process goes back to S306 and S307 after the value of k increases by 1; if k=K−1, the process goes back to S306 and S307 after the value of k increases by 1, and subsequently S308 is performed. When S307 is performed, it is necessary only to calculate $\alpha_K$, $a_K$, and $F_K$ for subsequent signal recovery.

S308. Recover the original signal, mainly including the following steps.

(1) Calculating, by using the following formula (3.18) a column vector $z_K$ composed of weight coefficients of K columns selected in the base matrix B:

$$z_K = F_K a_K \qquad (3.18)$$

(2) The initial value of the estimated value of x is $\hat{x} = 0_N$. In $\hat{x}$, let the $\tau_k^{th}$ item be $\hat{x}_{\tau_k} = z_k$ (k=1, 2, ..., K), where $z_k$ is the $k^{th}$ item of $z_K$, and $\tau_k$ is the $k^{th}$ item of the vector $\tau_K$.

(3) Determine the original signal by using the following formula (3.19):

$$\hat{s} = \Psi^H \hat{x} \qquad (3.19)$$

The original signal $\hat{s}$ is therefore obtained.

The method according to the present invention is applied to many communication systems or signal processing systems. For example, the technical solutions of the present invention are applicable to a system described in the document [1] ("From Theory to Practice: Sub-Nyquist Sampling of Sparse Wideband Analog Signals," IEEE JOURNAL OF SELECTED TOPICS IN SIGNAL PROCESSING, VOL. 4, NO. 2, APRIL 2010). For ease of understanding, the system is described in detail as follows with reference to FIG. 3.

Figure 4:
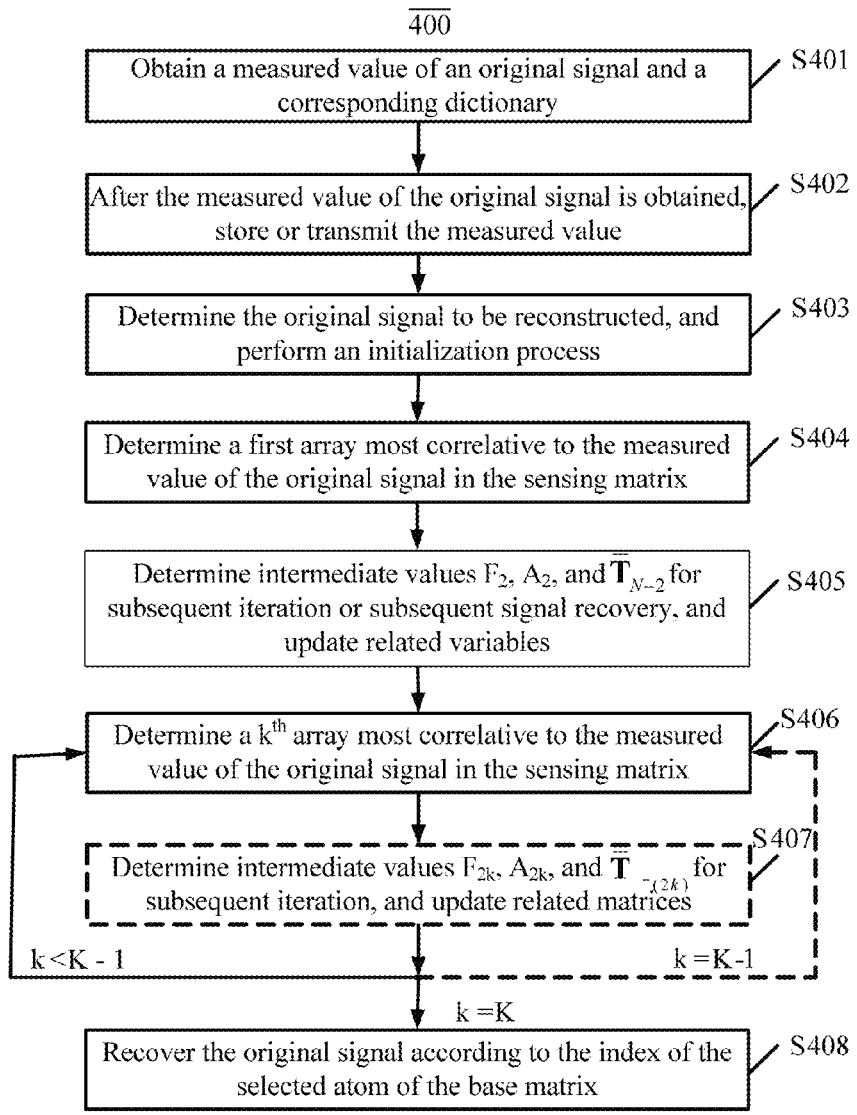
FIG. 4 is a schematic flowchart of a signal reconstruction method according to an embodiment of the present invention.

As shown in FIG. 4, an original signal x(t) includes Num_band narrowband signals (a positive frequency counts as a narrow-band signal, and a negative frequency counts as a narrow-band signal); and there are m channels in total, and each channel processes and collects samples of analog signals x(t) respectively. In each channel, a pseudo-random sequence is multiplied by the analog signal x(t) first, a result of the multiplication passes through a low-pass filter h(t), and then a low-rate analog-to-digital converter (ADC) collects samples of the signals. Subsequently, according to sample sequences y1[n], y2[n], ..., ym[n], (n=1, 2, ..., Num_sample) obtained by the channels, an original signal x is recovered through a signal reconstruction method. A sample sequence of the $i^{th}$ channel is represented as yi[n], where n=1, 2, ..., and Num_sample represents an $n^{th}$ sample value.

The $n^{th}$ sample value on all the m channels is denoted as a column vector $\vec{y}[n]$:

$$\vec{y}[n] = \begin{bmatrix} y_1[n] \\ y_2[n] \\ \vdots \\ y_m[n] \end{bmatrix},$$

thereby calculating $$Q = \sum_{n=1}^{Num\_sample} \vec{y}[n] \times \vec{y}^T[n].$$

The number of nonzero positive eigenvalues of Q is determined as Num_positive_eigenvalue. In practice, the number of eigenvalues that is greater than a very small positive number (such as $1 \times 10^{-8}$) is statisticized. Num_positive_eigenvalue or (2×Num_band), whichever is smaller, is selected and denoted as Num_valid_eigenvalue.

Num_valid_eigenvalue=L largest eigenvalues are selected in the eigenvalues of Q, and denoted as $\xi_j$ (j=1, 2, ..., Num_valid_eigenvalue). Meanwhile, Num_valid_eigenvalue eigenvectors corresponding to the Num_valid_eigenvalue eigenvalues respectively are selected and denoted as $v_j$ (j=1, 2, ..., Num_valid_eigenvalue).

Multiple y vectors in an orthogonal matching pursuit method are $Y = [v_1\sqrt{\xi_1}\ v_2\sqrt{\xi_2}\ \ldots\ v_L\sqrt{\xi_L}] = [y_1\ y_2\ \ldots\ y_L]$, and Y=TX, where $Y=[y_1\ y_2\ \ldots\ y_L]$, $X=[x_1\ x_2\ \ldots\ X_L]$. That is equivalent to having multiple constraint conditions, that is, $y_j = Tx_j$, where j=1, 2, ..., L.

In all $x_j$ (j=1, 2, ..., L), positions of nonzero items are the same. Therefore, in the method given in the reference document [1], for each constraint condition $y_j = Tx_j$ (j=1, 2, ..., L), the orthogonal matching pursuit method is applied to perform signal recovery to calculate the estimation $\hat{x}_j$ of $x_j$, but step 2 in the prior art is modified, so that L constraint conditions $y_j = Tx_j$ (j=1, 2, ..., L) determine the same column (that is, atom).

For each constraint condition $y_j = Tx_j$, step 1 in the prior art is applied in the reference document, that is, a correlation between a $k^{th}$ residual error and each column in a sensing matrix cleared of k−1 arrays is calculated by using formula $q_{\Gamma_{-(k-1),j}} = T^H_{\Gamma_{-(k-1)}} \tilde{y}_j$, where the subscript j represents a residual error $\tilde{y}$ and correlation $q_{\Gamma_{-(k-1)}}$ corresponding to the constraint condition $y_j = Tx_j$; and a sequence number of a column with the maximum correlation value is determined by using formula (1.3b):

$$\rho_k = \underset{i=1}{\overset{\square^-(k-1)}{\operatorname{argmax}}} \left( \sum_{j=1}^{L} |q_{i,j}^{\square^-(k-1)}|^2 \right) / |\delta_i|^2 \qquad (1.3b)$$

In the above formula, $q_{i,j}^{\square^-(k-1)}$ is an $i^{th}$ item of $q_{\Gamma_{-(k-1),j}}$. For ease of description, let:

$$Q_{-(k-1)} = [q_{\Gamma_{-(k-1),1}}\ q_{\Gamma_{-(k-1),2}} \ldots q_{\Gamma_{-(k-1),L}}].$$

However, the method disclosed in the reference document is rather complicated in implementing the orthogonal matching pursuit method, and therefore, the method of the present invention may be applied to implement the orthogonal matching pursuit method to reduce the complexity.

Figure 5:
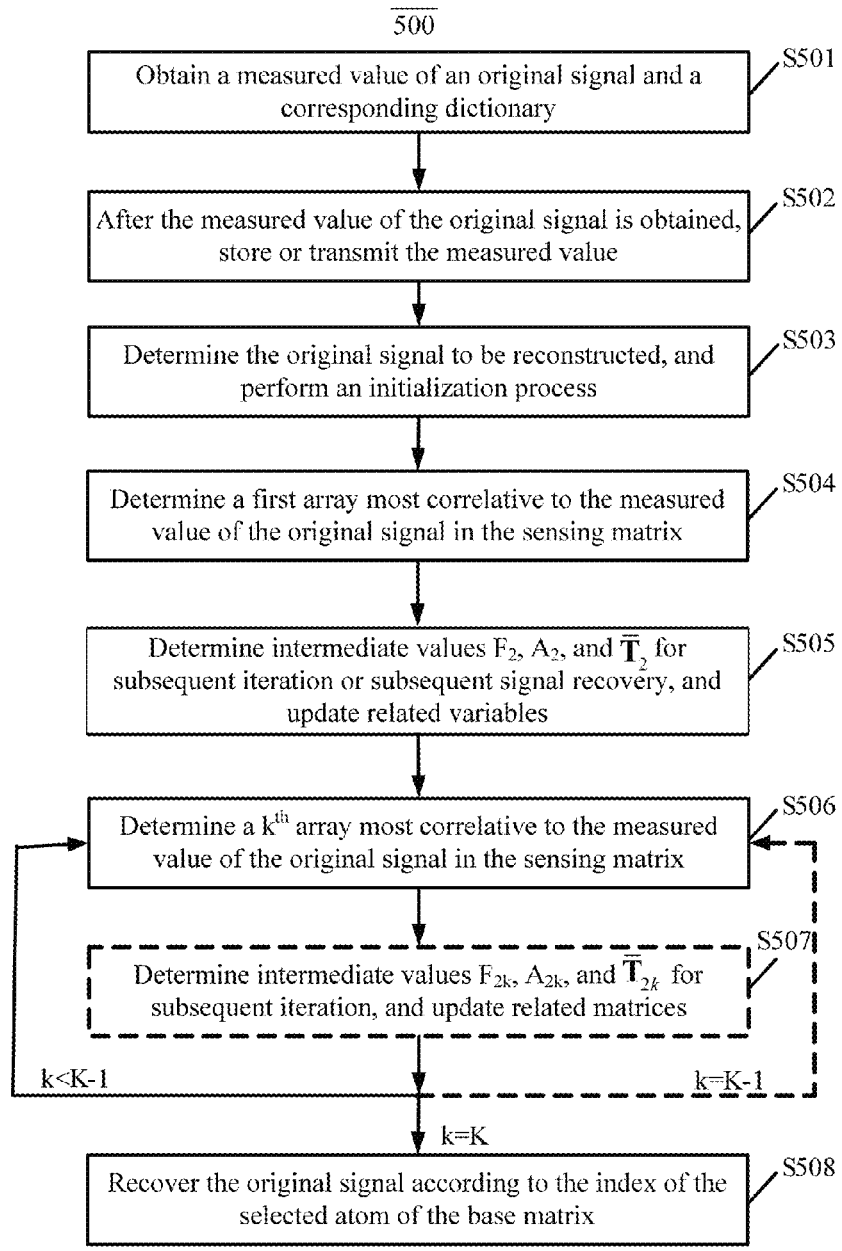
FIG. 5 is a schematic flowchart of a signal reconstruction method according to an embodiment of the present invention.

FIG. 5 is a schematic flowchart of a signal reconstruction method 400 according to an embodiment of the present invention. A dictionary T with M rows and N columns fulfills: an $i^{th}$ column and an $(N-i+1)^{th}$ column are mutually conjugate (i=1, 2, ..., N/2), and all items in $Y=[y_1\ y_2\ \ldots\ y_L]$ are real numbers.

As shown in FIG. 4, the method 400 includes the following steps.

S401. Obtain, by using the method disclosed in the reference document [1], a measured value (non-adaptive linear projection) $Y=[y_1\ y_2\ \ldots\ y_L]$ of an original signal and a corresponding dictionary (that is, sensing matrix) T, where the dictionary T with M rows and N columns fulfills: an $i^{th}$ column and a $(N-i+1)^{th}$ column are mutually conjugate, and all items in $Y=[y_1\ y_2\ \ldots\ y_L]$ are real numbers.

S402. After the measured value of the original signal is obtained, store or transmit the measured value.

S403. Determine the original signal to be reconstructed. First, perform an initialization process, where the initialization process may include the following steps.

(1) Set an initial value $\tilde{y}_j = y_j$ of a residual error, where j=1, 2, ..., L, that is, set the initial value of the residual error to be a measured value vector.

(3) Set the sensing matrix T, where the sensing matrix is an N×N matrix; and denote the square of the modulus of columns in the sensing matrix T as $\delta'_{\Gamma_{-(0)}} = [\|t_{(1)}\|_2^2\ \|t_{(2)}\|_2^2\ \ldots\ \|t_{(N)}\|_2^2]$, where $t_{(i)}$ (i=1, 2, ..., N) represents the $i^{th}$ column of T, and $\|t_{(i)}\|_2$ represents the modulus of the vector $t_{(i)}$; set $\pi_{\sqcup_{-(0)}}$, where $\pi_{\sqcup_{-(0)}} = [1\ 2\ \ldots\ N]^T$ records a sequence number of each column of the sensing matrix, and is an initial value of an atom sequence number set to be selected. An index of a selected column of a base matrix B is denoted as a column vector $\tau$, and its initial value $\tau_0$ is an empty vector.

(4) Calculate and store a correlation matrix $\Theta = T^H T$ of the sensing matrix, or calculate and store off-diagonal items (that is, items that are not on the diagonal) of a correlation matrix $\Theta = T^H T$ of the sensing matrix. It should be noted that, because the sensing matrix T is generally constant, or at least constant in a long time, it is not necessary to calculate the correlation matrix $\Theta = T^H T$ of the sensing matrix on every occasion of reconstructing the original signal. After the correlation matrix $\Theta = T^H T$ of the sensing matrix is calculated and stored, the stored correlation matrix $\Theta = T^H T$ is reusable in subsequent reconstruction of the original signal and the correlation matrix does not need to be calculated again.

S404. Determine a first array most correlative to the measured value of the original signal in the sensing matrix, which may include the following steps.

(1) Calculate a correlation between a first residual error and each column in the sensing matrix by using formula (4.1):

$$q_{N,j} = T_N^H \tilde{y}_j = T_N^H y_j \qquad (4.1)$$

In the above formula, $j=1, 2, \ldots, L$. The first residual error is the initial value of the residual error, and is equal to the measured value vector. For ease of description, subsequently, let $Q_{-_{(2k-2)}} = [q_{r_{-(2k-2),1}} \; q_{r_{-(2k-2),2}} \; \ldots \; q_{r_{-(2k-2),L}}]$. It can be easily seen that, $Q_{-_{(2k-2)}}$ is always a matrix with $L-(2k-2)$ rows and L columns, and when k=1, $Q_{-_{(2k-2)}}$ is its initial value $Q_N = [q_{N,1} \; q_{N,2} \; \ldots \; q_{N,L}]$. Because the $i^{th}$ column and the $(N+1-i)^{th}$ column of $T_N$ are conjugately symmetric, only a correlation between the first residual error and about a half of columns of the sensing matrix $T_N$ needs to be calculated in practice, for example, a correlation between the first residual error and the first to $$\left\lceil \frac{N}{2} \right\rceil^{th}$$

columns of the sensing matrix $T_N$ is calculated, where $\lceil \alpha \rceil$ represents an integer greater than or equal to α and contiguous to α.

(2) Find a sequence number $\rho_1$ of a column with the maximum correlation value by using formula (4.2):

$$\rho_1 = \underset{i=1}{\overset{N}{\operatorname{argmax}}} \left( \sum_{j=1}^{L} |q_{i,j}^N|^2 \right) / \delta_i' \qquad (4.2)$$

In the above formula, $q_{i,j}^N$ is an $i^{th}$ item of $q_{N,j}$, and $\delta'_i$ is an $i^{th}$ item of $\delta'_{1-_{(0)}}$. If, in the previous step, only the correlation between the first residual error and the first to $$\left\lceil \frac{N}{2} \right\rceil^{th}$$

columns of the sensing matrix $T_N$ is calculated, the formula applied here is:

$$\rho_1 = \underset{i=1}{\overset{\lceil N/2 \rceil}{\operatorname{argmax}}} \left( \sum_{j=1}^{L} |q_{i,j}^N|^2 \right) / \delta_i'.$$

Therefore, it can be determined that the $\rho_1^{th}$ column in the sensing matrix is the first column most correlative to the measured value of the original signal in the sensing matrix. Meanwhile, it is further determined that the $(\bar{\rho}_1 = N - \rho_1 + 1)^{th}$ column in the sensing matrix is also a column most correlative to the measured value of the original signal in the sensing matrix. This is because the dictionary T fulfills that the $i^{th}$ column and the $(N-i+1)^{th}$ column are mutually conjugate.

S405. Determine intermediate values for subsequent iteration or subsequent signal recovery, and update related variables.

First, intermediate parameters are calculated by using formula $\lambda_1 = \sqrt{1/\theta_{\rho_1,\rho_1}}$, where $\theta_{\rho_1,\rho_1}$ is an item in the $\rho_1^{th}$ row and the $\rho_1^{th}$ column in the matrix $\Theta_{1-_{(0)}}$; then $u''_1 = \lambda_1 \times \theta_{\rho_1, N-\rho_1+1}$, $\lambda_2 = 1/\sqrt{\theta_{\rho_1,\rho_1} - (u''_1)^* u''_1}$, and $f_{1,2} = -\lambda_2 \lambda_1 u''_1$ are calculated; and finally, $F_2$ for subsequent iteration is obtained by using formula (4.3):

$$F_2 = \begin{bmatrix} \lambda_1 & f_{1,2} \\ 0 & \lambda_2 \end{bmatrix} \qquad (4.3)$$

(2) Let $q_{\rho_1,:}^H = Q_N(\rho_1, :)$, that is, $q_{\rho_1,:}^H$ is the $\rho_1^{th}$ row of $Q_N$, and then obtain an intermediate parameter $A_2$ for subsequent iteration by using formula (4.4):

$$A_2 = \begin{bmatrix} \lambda_1 q_{\rho_1,:}^H \\ f_{1,2}^* q_{\rho_1,:}^H + \lambda_2 (q_{\bar{\rho}_1,:}^H)^* \end{bmatrix} \qquad (4.4)$$

In the above formula, the matrix $A_2$ may be represented as $$A_2 = \begin{bmatrix} a_{1,:}^H \\ a_{2,:}^H \end{bmatrix},$$

where $a_{1,:}^H$ and $a_{2,:}^H$ represent the first row and the second row of the matrix $A_2$ respectively, and $a_{1,:}^H$ and $a_{2,:}^H$ make up a first difference coefficient.

(3) Let an index of a selected atom of the base matrix be $\tau_2 = [\rho_1 \; \bar{\rho}_1]^T = [\rho_1 \; N-\rho_1+1]^T$; and delete the $\rho_1^{th}$ item and the $(N-\rho_1+1)^{th}$ item from $\delta'_N$ and an atom index $\pi_N$ to be selected respectively to obtain $\delta'_{N-2}$ and a $\pi_{N-2}$ for subsequent iteration.

(4) Delete the $\rho_1^{th}$ row and the $(N-\rho_1+1)^{th}$ row from $\Theta_{1-_{(0)}}$ to obtain $\Theta'_{1-_{(0)}}$; then save the $\rho_1^{th}$ column of $\Theta'_{1-_{(0)}}$, denote it as $\theta'_{(\rho_1)}$, that is, $\theta'_{(\rho_1)} = \Theta'_{1-_{(0)}}(:,\rho_1)$; and subsequently, delete the $\rho_1^{th}$ column and the $(N-\rho_1+1)^{th}$ column from $\Theta'_{1-_{(0)}}$ to obtain $\Theta_{1-_{(2)}}$ for subsequent iteration; and finally, obtain an intermediate parameter $T_{N-2}$ (that is, $T_{N-(2k-2)}$ when k=2) for subsequent iteration by using formula (4.5):

$$T_{N-2} = [\lambda_1 \theta'_{(\rho_1)} f_{1,2} \theta'_{(\rho_1)} + \lambda_2 \times \text{flipud}(\theta'^*_{(\rho_1)})] \qquad (4.5)$$

In the above formula, flipud refers to reversing order of a column vector, that is, changing the first item of the column vector to the last item, changing the second item to the last item but one, …, and changing the last item to the first item; and the matrix $T_{N-2}$ may be represented as $T_{N-2} = [\bar{t}_1 \; \bar{t}_2]$, where $\bar{t}_1$ and $\bar{t}_2$ represent the first column and the second column of the matrix $T_{N-2}$ respectively, and $\bar{t}_1$ and $\bar{t}_2$ make up a first base difference.

(5) Delete the $\rho_1^{th}$ row and the $(N-\rho_1+1)^{th}$ row from the matrix $Q_{-_{(0)}}$ to obtain $Q'_{1-_{(2)}}$ for next iteration; and use $\bar{Q}_{-_{(2)}} = Q'_{1-_{(2)}}$ to record the correlation between the first residual error and each column in the sensing matrix $T_{N-2}$.

S306. Determine a $k^{th}$ array most correlative to the measured value of the original signal in the sensing matrix, where an initial value of k is 2, which may include the following steps.

(1) Calculate, by using formula (4.6), a correlation $q_{\sqcup_{-(2k-2)}}$ between a $k^{th}$ residual error and each column in $T_{\sqcup_{-(2k-2)}}$ (that is, $\sqcup^-(2k-2)$ columns to be selected in the sensing matrix T), that is:

$$Q_{\sqcup-(2k-2)} = Q'_{\sqcup-(2k-2)} - [\bar{t}_{2k-3} \; \bar{t}_{2k-2}] \begin{bmatrix} a^H_{2k-3,:} \\ a^H_{2k-2,:} \end{bmatrix} \quad (4.6)$$

In the above formula, the vectors $\bar{t}_{2k-3}$ and $\bar{t}_{2k-2}$ make up a set $[\bar{t}_{2k-3} \bar{t}_{2k-2}]$, that is, a matrix $[\bar{t}_{2k-3} \bar{t}_{2k-2}]$, which is a $(k-1)^{th}$ base difference; the vectors $a_{2k-3,:}^H$ and $a_{2k-2,:}^H$ make up a set $$\begin{bmatrix} a^H_{2k-3,:} \\ a^H_{2k-2,:} \end{bmatrix},$$

which is a $(k-1)^{th}$ difference coefficient; and the vectors $a_{2k-3,:}^H$ and $a_{2k-2,:}^H$ themselves are made up of multiple scalars. The $(k-1)^{th}$ base difference and the $(k-1)^{th}$ difference coefficient have been obtained in preceding steps.

Because the $i^{th}$ column and the $(N-2k+3-i)^{th}$ column of $T_{-(2k-2)}$ are conjugately symmetric, only the correlation between the first residual error and about a half of columns of the sensing matrix $T_{\sqcap_{-(2k-2)}}$ needs to be calculated in practice, for example, a correlation between the first residual error and the first to $$\left\lceil \frac{N-(2k-2)}{2} \right\rceil^{th}$$

columns of the sensing matrix $T_{\sqcup_{-(2k-2)}}$. It is apparent to a person skilled in the art that, when only the correlation between the first residual error and the first to $$\left\lceil \frac{N-(2k-2)}{2} \right\rceil^{th}$$

columns of the sensing matrix $T_{\sqcap_{-(2k-2)}}$ is calculated, it is necessary only to use the $(k-1)^{th}$ base difference, that is, the first to $$\left\lceil \frac{N-(2k-2)}{2} \right\rceil^{th}$$

rows of the matrix $[\bar{t}_{2k-3} \bar{t}_{2k-2}]$.

(2) Determine a sequence number $\rho_k$ of a column with the maximum correlation value by using formula (4.7):

$$\rho_k = \operatorname*{argmax}_{i=1}^{N-(2k-2)} \left( \sum_{j=1}^{L} |q_{i,j}^{N-(2k-2)}|^2 \right) / |\delta_i|^2, \quad (4.7)$$

where, $q_{i,j}^{N-(2k-2)}$ is an item in an $i^{th}$ row and a $j^{th}$ column of the matrix $Q_{-_{(2k-2)}}$; then obtain a sequence number $\bar{\rho}_k = N-(2k-2)+1-\rho_k$ of another column with the maximum correlation value. If, in the previous step, only the correlation between the first residual error and the first to $$\left\lceil \frac{N-(2k-2)}{2} \right\rceil^{th}$$

columns of the sensing matrix $T_{\sqcup_{-(2k-2)}}$ is calculated, the formula applied here is:

$$\rho_k = \operatorname*{argmax}_{i=1}^{\lceil(N-2k+2)/2\rceil} \left( \sum_{j=1}^{L} |q_{i,j}^{N-(2k-2)}|^2 \right) / |\delta_i|^2.$$

S407. Determine intermediate values for subsequent iteration or subsequent signal recovery, and update related variables.

(1) Let a vector $\tilde{u}'_{2k-2}$ be equal to a conjugate transposition of the $\rho_k^{th}$ row of the matrix $\bar{T}_{-_{(2k-2)}}$, that is, $\tilde{u}'_{2k-2} = (T_{\sqcup_{-(2k-2)}}(\rho_k,:))^H$, and then calculate $\lambda_{2k-1}=1/\sqrt{\theta_{\rho_k,\rho_k}-\tilde{u}'_{2k-2}^H \tilde{u}'_{2k-2}}$ and $w_{2k-2}=F_{2k-2}\tilde{u}'_{2k-2}$, where it should be noted that, in the $k^{th}$ iteration, $\theta_{i,j}$ represents an item in the $i^{th}$ row and the $j^{th}$ column of the matrix $\Theta_{\_-_{(2k-2)}}$; calculate $\tilde{u}''_{2k-1}=\lambda_{2k-1}(\theta_{\bar{\rho}_k,\rho_k}-T_{N-(2k-2)}(\bar{\rho}_k,:) \times \tilde{u}'_{2k-2})^*$, where $T_{N-(2k-2)}(\bar{\rho}_k,:)$ represents the $\bar{\rho}_k^{th}$ row of the matrix $T_{N-(2k-2)}$, so that $$\tilde{u}''_{2k-1} = \begin{bmatrix} (\bar{T}_2(\bar{\rho}_k,:))^H \\ \tilde{u}''_{2k-1} \end{bmatrix}$$

is obtained; and then calculate $\lambda_{2k}=1/\sqrt{\theta_{\bar{\rho}_k,\bar{\rho}_k}-(\tilde{u}''_{2k-1})^H \tilde{u}''_{2k-1}}$ and $f_{2k-1,2k}=-\lambda_{2k}\lambda_{2k-1}\tilde{u}''_{2k-1}$; and finally, obtain an intermediate parameter $F_{2k}$ for subsequent iteration by using formula (4.8):

$$F_{2k} = \begin{bmatrix} F_{2k-2} & -\lambda_{2k-1}w_{2k-2} & (-f_{2k-1,2k}w_{2k-2} - \lambda_{2k} \times \text{reorder}(w_{2k-2})) \\ 0^H_{2k-2} & \lambda_{2k-1} & f_{2k-1,2k} \\ 0^H_{2k-2} & 0 & \lambda_{2k} \end{bmatrix} \quad (4.8)$$

In the above formula, reorder($w_{2k-2}$) refers to transforming the vector $w_{2k-2}$ in the following way: exchanging positions of a $(2i-1)^{th}$ item and a $2i^{th}$ item of the vector $w_{2k-2}$, and then calculating a conjugate of each item of the vector, where $i=1, 2, \ldots, k-1$. It should be noted that, only $\lambda_{2k-1}, f_{2k-1,2k}$, and $\lambda_{2k}$ are used in the iteration; $w_{2k-2}$ and the entire $F_{2k}$ are not used in the iteration. Therefore, $w_{2k-2}$ and the entire $F_{2k}$ may be not calculated in each iteration, so as to reduce the amount of calculation in each iteration; $F_{2k}$ may also be calculated by other methods than the method disclosed in the present invention.

(4) Calculate a row vector $\tilde{a}_{2k-2,:}^H=-\tilde{u}'_{2k-2}^H A_{(2k-2)}+\tilde{q}_{\rho_k,:}^H$, where $\tilde{q}_{\rho_k,:}^H$ is the $\rho_k^{th}$ row of the matrix $\bar{Q}_{\_-_{(2k-2)}}$, or, according to $\tilde{a}_{2k-2,:}^H=Q_{\_-_{(2k-2)}}(\rho_k,:)$, obtain a row vector $\tilde{a}_{2k-,:}^H$ directly, where $Q_{\sqcup_{-(2k-2)}}(\rho_k,:)$ is the $\rho_k^{th}$ row of $Q_{\_-_{(2k-2)}}$; and then obtain an intermediate parameter $A_{2k}$ for subsequent iteration by using formula (4.9):

$$A_{2k} = \begin{bmatrix} A_{(2k-2)} \\ \lambda_{2k-1}\tilde{a}_{2k-2,:}^H \\ (f_{2k-1,2k})^*\tilde{a}_{2k-2,:}^H + \lambda_{2k}(\tilde{a}_{2k-2,:}^H)^* \end{bmatrix} \quad (4.9)$$

In the above formula, $A_{2k}$ may also be represented as $$A_{2k} = \begin{bmatrix} A_{(2k-2)} \\ a_{2k-1,:}^H \\ a_{2k,:}^H \end{bmatrix},$$

where $a_{2k-1,:}^H$ and $a_{2k,:}^H$ the $(2k-1)^{th}$ row and the $2k^{th}$ row of $A_{2k}$ respectively, and $a_{2k-1,:}^H$ and $a_{2k,:}^H$ make up a $k^{th}$ difference coefficient.

(5) Let an index of a selected atom of the base matrix be $\tau_{2k} = [\tau_{2k-2}^T \pi_{\rho_k} \pi_{\bar{\rho}_k}]^T$; and delete the $\rho_k^{th}$ item and the $(\bar{\rho}_k)^{th}$ item from $\delta'_{\sqcap_{-(2k-2)}}$ and an atom index $\pi_{\sqcup_{-(2k-2)}}$ to be selected respectively to obtain $\delta'_{\sqcap_{-(2k)}}$ and $\pi_{\sqcup_{-(2k)}}$ for subsequent iteration.

(6) Delete the $\rho_k^{th}$ row and the $(\bar{\rho}_k)^{th}$ row from $\Theta_{\sqsubset_{-(2k-2)}}$ to obtain $\Theta'_{\sqsubset_{-(2k-2)}}$; then save the $\rho_k^{th}$ column of $\Theta'_{\sqcup_{-(2k-2)}}$, denote it as $\theta'_{(\rho_k)}$, that is, $\theta'_{(\rho_k)} = \Theta'_{\sqcup_{-(2k-2)}}(:,\rho_k)$; finally, delete the $\rho_k^{th}$ column and the $(\bar{\rho}_k)^{th}$ column from $\Theta'_{\sqcup_{-(2k-2)}}$ to obtain $\Theta_{\sqcup_{-(2k)}}$ for subsequent iteration; and delete the $\rho_k^{th}$ row and the $(\bar{\rho}_k)^{th}$ row from $\bar{T}_{\sqsubset_{-(2k-2)}}$ to obtain $\bar{T}'_{\sqsubset_{-(2k-2)}}$, and then calculate $\tilde{t}_{\sqcup_{-(2k)}} = \theta'_{(\rho_k)} - \bar{T}'_{\sqsubset_{-(2k-2)}}\tilde{u}'_{2k-2}$; and finally, obtain an intermediate parameter $\bar{T}_{\sqsubset_{-(2k)}}$ for subsequent iteration by using formula (4.10):

$$\bar{T}_{\sqcup_{-(2k)}} = [\bar{T}'_{\sqcup_{-(2k-2)}} \lambda_{2k-1} \tilde{t}_{\sqcup_{-(2k)}} (f_{2k-1,2k} \bar{T}_{\sqcup_{-(2k)}} + \lambda_{2k} \times \text{flipud}(\tilde{t}^*_{\sqcup_{-(2k)}}))] \quad (4.10)$$

In the above formula, $\bar{T}_{\sqcup_{-(2k)}}$ may be represented as $\bar{T}_{\sqcup_{-(2k)}} = [\bar{T}'_{\sqcup_{-(2k-2)}} \bar{t}_{2k-1} \bar{t}_{2k}]$, where $\bar{t}_{2k-1}$ and $\bar{t}_{2k}$ represent the $(2k-1)^{th}$ column and the $2k^{th}$ column of $\bar{T}_{\sqcup_{-(2k)}}$ respectively, and $\bar{t}_{2k-1}$ and $\bar{t}_{2k}$ make up a $k^{th}$ base difference.

(7) Delete the $\rho_k^{th}$ row and the $(\bar{\rho}_k)^{th}$ row from matrix $\mathbf{Q}'_{\sqcup_{-(2k-2)}}$ to obtain $\mathbf{Q}'_{\sqcup_{-(2k)}}$ for next iteration; and delete the $\rho_k^{th}$ row and the $(\bar{\rho}_k)^{th}$ row from matrix $\tilde{\mathbf{Q}}_{\sqsubset_{-(2k-2)}}$ to obtain $\tilde{\mathbf{Q}}_{\sqsubset_{-(2k)}}$ for next iteration.

(8) If $k < K/2 - 1$ (generally, K is smaller than or equal to K_sparse), the process goes back to S406 and S407 after the value of k increases by 1; if $k = K/2 - 1$, the process goes back to S406 and S407 after the value of k increases by 1, and subsequently S408 is performed.

When S407 is performed, it is necessary only to update the index $\tau_{2k}$ of the base matrix.

S408. Recover the original signal according to the index $\tau_{2K}$ of the selected atom of the base matrix. For details, reference may be made to the prior art.

FIG. 5 is a schematic flowchart of a signal reconstruction method 500 according to an embodiment of the present invention. As shown in FIG. 5, the method 500 includes:

S501. Obtain, by using the method disclosed in the reference document [1], a measured value (non-adaptive linear projection) $Y = [y_1 \; y_2 \; \ldots \; y_L]$ of an original signal and a corresponding dictionary (that is, sensing matrix) T, where the dictionary T with M rows and N columns fulfills: An $i^{th}$ column and a $(N-i+1)^{th}$ column are mutually conjugate, and all items in $Y = [y_1 \; y_2 \; \ldots \; y_L]$ are real numbers.

S502. After the measured value of the original signal is obtained, store or transmit the measured value.

S503. Determine the original signal to be reconstructed. First, perform an initialization process, where the initialization process may include the following steps.

(1) Set an initial value $\tilde{y}_j = y_j$ of a residual error, where $j = 1, 2, \ldots, L$, that is, set the initial value of the residual error to be a measured value vector.

(2) Set a sensing matrix T, where the sensing matrix is an $N \times N$ matrix; and denote the square of the modulus of columns in the sensing matrix T as $\delta' = [\|t_{(1)}\|_2^2 \; \|t_{(2)}\|_2^2 \; \ldots \; \|t_{(N)}\|_2^2]$, where $t_{(i)}$ ($i = 1, 2, \ldots, N$) represents the $i^{th}$ column of T, and $\|t_{(i)}\|_2$ represents the modulus of the vector $t_{(i)}$. An index of a selected column of a base matrix B is denoted as a column vector $\tau$, and its initial value $\tau_0$ is an empty vector.

(3) Calculate and store a correlation matrix $\Theta = T^H T$ of the sensing matrix, or calculate and store off-diagonal items (that is, items that are not on the diagonal) of a correlation matrix $\Theta = T^H T$ of the sensing matrix. It should be noted that, because the sensing matrix T is generally constant, or at least constant in a long time, it is not necessary to calculate the correlation matrix $\Theta = T^H T$ of the sensing matrix on every occasion of reconstructing the original signal. After the correlation matrix $\Theta = T^H T$ of the sensing matrix is calculated and stored, the stored correlation matrix $\Theta = T^H T$ is reusable in subsequent reconstruction of the original signal and the correlation matrix does not need to be calculated again.

S504. Determine a first array most correlative to the measured value of the original signal in the sensing matrix, which may include the following steps:

(1) Calculate a correlation between a first residual error and each column in the sensing matrix by using formula (5.1):

$$q_j^0 = T^H \tilde{y}_j = T^H y_j \quad (5.1)$$

In the above formula, $j = 1, 2, \ldots, L$. The first residual error is the initial value of the residual error, and is equal to the measured value vector. For ease of description, subsequently, let $Q^0 = [q_1^0 \; q_2^0 \; \ldots \; q_L^0]$. It can be easily seen that, $Q^0$ is always a matrix with N rows and L columns. Because the $i^{th}$ column and the $(N+1-i)^{th}$ column of T are conjugately symmetric, only a correlation between the first residual error and about a half of columns of the sensing matrix T needs to be calculated in practice, for example, a correlation between the first residual error and the first to $$\left\lceil \frac{N}{2} \right\rceil^{th}$$

columns of the sensing matrix T.

(2) Find a sequence number $\rho_1$ of a column with the maximum correlation value by using formula (5.2):

$$\rho_1 = \arg\max_{i=1}^{N}\left(\sum_{j=1}^{L} |q_{i,j}^0|^2\right) \bigg/ \delta'_i \quad (5.2)$$

In the above formula, $q_{i,j}^0$ is an $i^{th}$ item of $q_j^0$, and $\delta'_i$ is an $i^{th}$ item of $\delta'_{\sqcap_{-(0)}}$. If, in the previous step, only the correlation between the first residual error and the first to $$\left\lceil \frac{N}{2} \right\rceil^{th}$$

columns of the sensing matrix T is calculated, the formula applied here is:

$$\rho_1 = \underset{i=1}{\overset{[N/2]}{\mathrm{argmax}}} \left( \sum_{j=1}^{L} |q_{i,j}^0|^2 \right) \bigg/ \delta_i'.$$

Therefore, it can be determined that the $\rho_1{}^{th}$ column in the sensing matrix is the first column most correlative to the measured value of the original signal in the sensing matrix. Meanwhile, it is further determined that the $(\bar{\rho}_1 = N - \rho_1 + 1)^{th}$ column in the sensing matrix is also a column most correlative to the measured value of the original signal in the sensing matrix. This is because the dictionary T fulfills that the $i^{th}$ column and the $(N - i + 1)^{th}$ column are mutually conjugate.

S505. Determine intermediate values for subsequent iteration or subsequent signal recovery, and update related variables.

First, intermediate parameters are calculated by using formula $\lambda_1 = \sqrt{1/\theta_{\rho_1,\rho_1}}$, where $\theta_{\rho_1,\rho_1}$ is an item in the $\rho_1{}^{th}$ row and the $\rho_1{}^{th}$ column in the matrix $\Theta$; then $u''_1 = \lambda_1 \times \theta_{\rho_1, N - \rho_1 + 1}$, $\lambda_2 = 1/\sqrt{\theta_{\rho_1, \rho_1} - (u''_1)^* u''_1}$, and $f_{1,2} = -\lambda_2 \lambda_1 u''_1$ are calculated; and finally, $F_2$ for subsequent iteration is obtained by using formula (5.3):

$$F_2 = \begin{bmatrix} \lambda_1 & f_{1,2} \\ 0 & \lambda_2 \end{bmatrix} \quad (5.3)$$

(2) Let $q_{\rho_1,:}{}^H = Q(\rho_1,:)$, that is, $q_{\rho_1,:}{}^H$ is the $\rho_1{}^{th}$ row of Q, and then obtain an intermediate parameter $A_2$ for subsequent iteration by using formula (5.4):

$$A_2 = \begin{bmatrix} \lambda_1 q_{\rho_1,:}^H \\ f_{1,2}^* q_{\rho_1,:}^H + \lambda_2 (q_{\rho_1,:}^H)^* \end{bmatrix} \quad (5.4)$$

In the above formula, the matrix $A_2$ may be represented as $$A_2 = \begin{bmatrix} a_{1,:}^H \\ a_{2,:}^H \end{bmatrix},$$

where $a_{1,:}{}^H$ and $a_{2,:}{}^H$ represent the first row and the second row of the matrix $A_2$ respectively, and $a_{1,:}{}^H$ and $a_{2,:}{}^H$ make up a first difference coefficient.

(3) Obtain an intermediate parameter $T_2$ for subsequent iteration by using formula (5.5):

$$\bar{T}_2 = [\lambda_1 \theta_{(\rho_1)}, f_{1,2} \theta_{(\rho_1)} + \lambda_2 \times \mathrm{flipud}(\theta^*_{(\rho_1)})] \quad (5.5)$$

In the above formula, $\theta_{(\rho_1)}$ is the $\rho_1{}^{th}$ column of the matrix $\Theta$; flipud refers to reversing order of a column vector, that is, changing the first item of the column vector to the last item, changing the second item to the last item but one, . . . , and changing the last item to the first item; and the matrix $T_2$ may be represented as $T_2 = [\bar{t}_1 \ \bar{t}_2]$, where $\bar{t}_1$ and $\bar{t}_2$ represent the first column and the second column of the matrix $T_2$ respectively, and $\bar{t}_1$ and $\bar{t}_2$ make up a first base difference.

S506. Determine a $k^{th}$ array most correlative to the measured value of the original signal in the sensing matrix, where an initial value of k is 2, which may include the following steps.

(1) Calculate, by using formula (5.6), a correlation $q_j^{k-1}$ between a $k^{th}$ residual error and each column in the sensing matrix T, where j=1, 2, . . . , L, that is:

$$Q^{k-1} = Q^{k-2} - [\bar{t}_{2k-3} \ \bar{t}_{2k-2}] \begin{bmatrix} a_{2k-3,:}^H \\ a_{2k-2,:}^H \end{bmatrix} \quad (5.6)$$

In the above formula, $Q^{k-1} = [q_1^{k-1} \ q_2^{k-1} \ \ldots \ q_L^{k-1}]$, the vectors $\bar{t}_{2k-3}$ and $\bar{t}_{2k-2}$ make up a set $[\bar{t}_{2k-3} \ \bar{t}_{2k-2}]$, that is, a matrix $[\bar{t}_{2k-3} \ \bar{t}_{2k-2}]$, which is a $(k-1)^{th}$ base difference; the vectors $a_{2k-3,:}{}^H$ and $a_{2k-2,:}{}^H$ make up a set $$\begin{bmatrix} a_{2k-3,:}^H \\ a_{2k-2,:}^H \end{bmatrix},$$

which is a $(k-1)^{th}$ difference coefficient; and the vectors $a_{2k-3,:}{}^H$ and $a_{2k-2,:}{}^H$ themselves are made up of multiple scalars. The $(k-1)^{th}$ base difference and the $(k-1)^{th}$ difference coefficient have been obtained in preceding steps.

Because the $i^{th}$ column and the $(N + 1 - i)^{th}$ column of T are conjugately symmetric, only the correlation between the first residual error and about a half of columns of the sensing matrix T needs to be calculated in practice, for example, a correlation between the first residual error and the first to $$\left[\frac{N}{2}\right]^{th}$$

columns of the sensing matrix T.

(2) Determine a sequence number $\rho_k$ of a column with the maximum correlation value by using formula (5.7):

$$\rho_k = \underset{i=1}{\overset{N}{\mathrm{argmax}}} \left( \sum_{j=1}^{L} |q_{i,j}^{k-1}|^2 \right) \bigg/ |\delta_i|^2, \quad (5.7)$$

where, $q_{i,j}^{k-1}$ is an item in an $i^{th}$ row and a $j^{th}$ column of the matrix $Q^{k-1}$; then obtain a sequence number $\bar{\rho}_k = N + 1 - \rho_k$ of another column with the maximum correlation value. If, in the previous step, only the correlation between the first residual error and the first to $$\left[\frac{N}{2}\right]^{th}$$

columns of the sensing matrix T is calculated, the formula applied here is:

$$\rho_k = \underset{i=1}{\overset{[N/2]}{\mathrm{argmax}}} \left( \sum_{j=1}^{L} |q_{i,j}^{k-1}|^2 \right) \bigg/ |\delta_i|^2.$$

S507. Determine intermediate values for subsequent iteration or subsequent signal recovery, and update related variables.

(1) Let a vector $\tilde{u}'_{2k-2}$ be equal to a conjugate transposition of the $\rho_k{}^{th}$ row of the matrix $T_{2k-2}$, that is, $\tilde{u}'_{2k-2} = (T_{2k-2}(\bar{\rho}_k,:))^H$, and then calculate $\lambda_{2k-1} = 1/\sqrt{\theta_{\rho_k,\rho_k} - \tilde{u}'_{2k-2}{}^H \tilde{u}'_{2k-2}}$ and $w_{2k-2} = F_{2k-2} \tilde{u}'_{2k-2}$, where it should be noted that, in the $k^{th}$ iteration, $\theta_{i,j}$ represents an item in the $i^{th}$ row and the $j^{th}$ column of the matrix $\Theta$; then calculate $\tilde{u}''_{2k-1} = \lambda_{2k-1}(\theta_{\bar{\rho}_k,\rho_k} -$ $T_{2k-2}(\bar{\rho}_k,:) \times \tilde{u}'_{2k-2})^*$, where $T_{2k-2}(\bar{\rho}_k,:)$ represents the $\bar{\rho}_k^{th}$ row of the matrix $T_{2k-2}$; and calculate $\lambda_{2k}=1\sqrt{1/\lambda_{2k-1}^2 - |\tilde{u}''_{2k-1}|^2}$ and $f_{2k-1,2k}=-\lambda_{2k}\lambda_{2k-1}\tilde{u}''_{2k-1}$; and finally, obtain an intermediate parameter $F_{2k}$ for subsequent iteration by using formula (5.8):

$$F_{2k} = \begin{bmatrix} F_{2k-2} & -\lambda_{2k-1}w_{2k-2} & (-f_{2k-1,2k}w_{2k-2} - \lambda_{2k} \times \text{reorder}(w_{2k-2})) \\ 0_{2k-2}^H & \lambda_{2k-1} & f_{2k-1,2k} \\ 0_{2k-2}^H & 0 & \lambda_{2k} \end{bmatrix} \quad (5.8)$$

In the above formula, reorder($w_{2k-2}$) refers to transforming the vector $w_{2k-2}$ in the following way: exchanging positions of a $(2i-1)^{th}$ item and a $2i^{th}$ item of the vector $w_{2k-2}$, and then calculating a conjugate of each item of the vector, where $i=1, 2, \ldots, k-1$. It should be noted that, only $\lambda_{2k-1}, f_{2k-1,2k},$ and $\lambda_{2k}$ are used in the iteration; $w_{2k-2}$ and the entire $F_{2k}$ are not used in the iteration. Therefore, $w_{2k-2}$ and the entire $F_{2k}$ may be not calculated in each iteration, so as to reduce the amount of calculation in each iteration; and $F_{2k}$ may also be calculated by other methods than the method disclosed in the present invention.

(2) According to $\tilde{a}_{2k-2,:}^H = Q^{k-1}(\rho_k,:)$, obtain a row vector $\tilde{a}_{2k-2,:}^H$ directly, where $Q^{k-1}(\rho_k,:)$ is the $\rho_k^{th}$ row of $Q^{k-1}$; and then obtain an intermediate parameter $A_{2k}$ for subsequent iteration by using formula (5.9):

$$A_{2k} = \begin{bmatrix} A_{(2k-2)} \\ \lambda_{2k-1}\tilde{a}_{2k-2,:}^H \\ (f_{2k-1,2k})^*\tilde{a}_{2k-2,:}^H + \lambda_{2k}(\tilde{a}_{2k-2,:}^H)^* \end{bmatrix} \quad (5.9)$$

In the above formula, $A_{2k}$ may also be represented as $$A_{2k} = \begin{bmatrix} A_{(2k-2)} \\ a_{2k-1,:}^H \\ a_{2k,:}^H \end{bmatrix},$$

where $a_{2k-1,:}^H$ and $a_{2k,:}^H$ represent the $(2k-1)^{th}$ row and the $2k^{th}$ row of $A_{2k}$ respectively, and $a_{2k-1,:}^H$ and $a_{2k,:}^H$ make up a $k^{th}$ difference coefficient.

(3) Let an index of a selected atom of the base matrix be $\tau_{2k}=[\tau_{2k-2}^T \rho_k \bar{\rho}_k]^T = [\tau_{2k-2}^T \rho_k N+1-\rho_k]^T$.

(4) Calculate $t_k = \theta_{(\rho_k)} - T_{2k-2}\tilde{u}'_{2k-2}$, where $\theta_{(\rho_k)}$ is the $\rho_k^{th}$ column of $\Theta$; and then obtain an intermediate parameter $T_{2k}$ for subsequent iteration by using formula (5.10):

$$T_{2k} = [T_{2k-2}\ \lambda_{2k-1}\tilde{t}_k\ (f_{2k-1,2k}\tilde{t}_k + \lambda_{2k} \times \text{flipud}(\tilde{t}^*_k))] \quad (5.10)$$

In the above formula, $T_{2k}$ may be represented as $T_{2k}=[T_{2k-2}\ \bar{t}_{2k-1}\ \bar{t}_{2k}]$, where $\bar{t}_{2k-1}$ and $\bar{t}_{2k}$ represent the $(2k-1)^{th}$ column and the $2k^{th}$ column of $T_{2k}$ respectively, and $\bar{t}_{2k-1}$ and $\bar{t}_{2k}$ make up a $k^{th}$ base difference.

(5) If $k<K/2-1$ (generally, K is smaller than or equal to K_sparse), the process goes back to S506 and S507 after the value of k increases by 1; if $k=K/2-1$, the process goes back to S506 and S507 after the value of k increases by 1, and subsequently, S508 is performed. When S507 is performed, it is necessary only to update the index $\tau_{2k}$ of the base matrix.

S508. Recover the original signal according to the index $\tau_{2K}$ of the selected atom of the base matrix. For details, reference may be made to the prior art.

Figure 6:
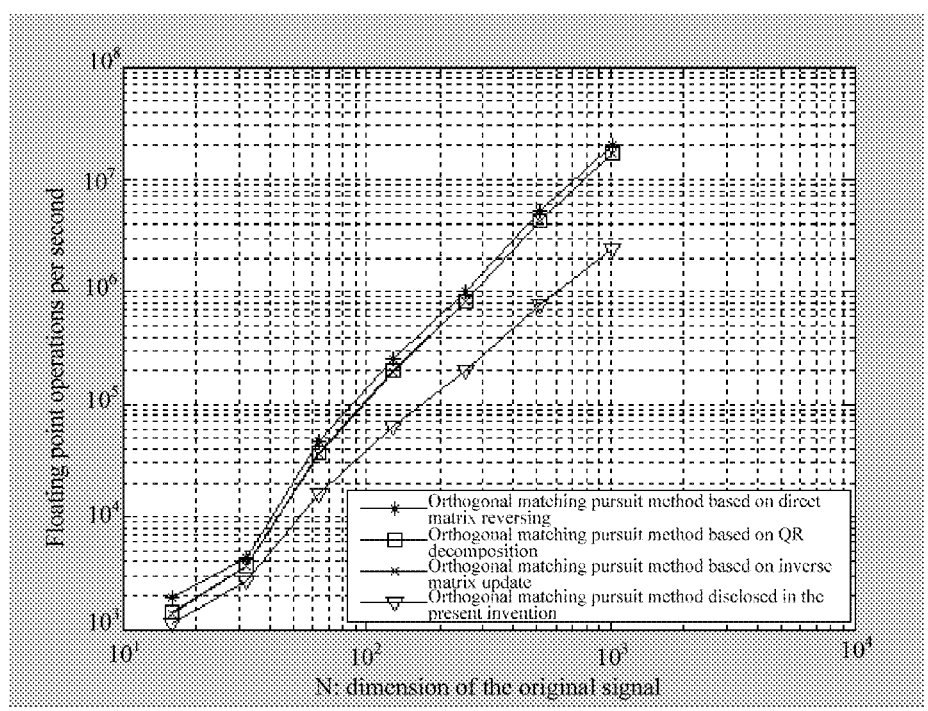
FIG. 6 is a diagram of comparison between simulation results of a signal reconstruction method in the prior art and a signal reconstruction method in an embodiment of the present invention.

In FIG. 6, complexity of implementing the following methods is simulated: an orthogonal matching pursuit method of direct matrix reversing that is described in the reference document [2] (Joel Tropp and Anna Gilbert, "Signal recovery from random measurements via orthogonal matching pursuit", IEEE Trans. on Information Theory, 53(12) pp. 4655-4666, December 2007); a QR decomposition-based orthogonal matching pursuit method that is described in the reference documents [2] and [3] (Thomas Blumensath, Mike E. Davies, "In Greedy Pursuit of New Directions: (Nearly) Orthogonal Matching Pursuit by Directional Optimisation", Proc. of the European Signal Processing Conference (EUSIPCO), Poznan, Poland, (2007)); an orthogonal matching pursuit method based on inverse matrix update that is described in the reference documents [4] (Yong Fang, Liang Chen, Jiaji Wu, Bormin Huang, "GPU Implementation of Orthogonal Matching Pursuit for Compressive Sensing", Parallel and Distributed Systems (ICPADS), 2011 IEEE 17$^{th}$ International Conference on, 2011, pp. 1044-1047) and [3]; and the orthogonal matching pursuit method that is disclosed in the present invention. Simulation parameters applied are the same as simulation parameters used in FIG. 5a of the reference document [5] (Stefan Kunis and Holger Rauhut, "Random sampling of sparse trigonometric polynomials II—Orthogonal matching pursuit versus basis pursuit", Preprint, 2006.), the X-coordinate employs a dimension N of the original signal s (that is, the N in "the original signal is represented as a column vector with N items"), $N=2^i$, where $i=4, 5, \ldots, 10$. Let the number of nonzero items in a sparse expression be $$K = \frac{1}{2}\sqrt{N},$$

and let the number of items of a linear measured value be $M=K \times (\log_2 N - 2)$.

As can be seen from the simulation results in FIG. 6, the implementation complexity of the present invention is about 15% of the implementation complexity of the prior art.

Therefore, in the embodiment of the present invention, the correlation between the $k^{th}$ residual error and the multiple columns in the sensing matrix is determined according to the correlation between the $(k-1)^{th}$ residual error and the multiple columns in the sensing matrix, and a column most correlative to the measured value of the original signal in the sensing matrix is further determined for recovering the signal. In this way, under the premise of ensuring proper recovery of the signal, the amount of calculation for reconstructing the signal can be reduced.

Figure 7:
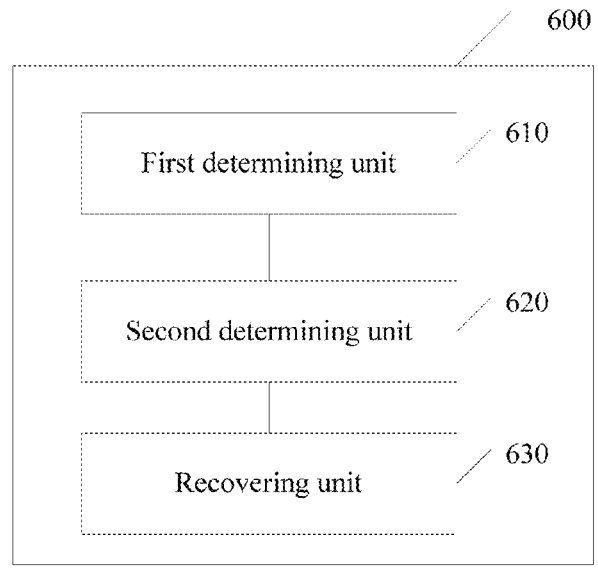
FIG. 7 is a schematic block diagram of a signal reconstruction apparatus according to an embodiment of the present invention.

FIG. 7 is a schematic block diagram of a signal reconstruction apparatus 600 according to an embodiment of the present invention. As shown in FIG. 7, the apparatus 600 includes a first determining unit 610 configured to determine a correlation between a first residual error and multiple columns in a sensing matrix according to a measured value of an original signal and the sensing matrix, and determine a first array most correlative to the measured value of the original signal in the sensing matrix according to the correlation between the first residual error and the multiple columns in the sensing matrix; a second determining unit 620 configured to determine a correlation between a $k^{th}$ residual error and the multiple columns in the sensing matrix according to a correlation between a $(k-1)^{th}$ residual error and the multiple columns in the sensing matrix, and determine a $k^{th}$ array most correlative to the measured value of the original signal in the sensing matrix according to the correlation between the $k^{th}$ residual error and the multiple columns in the sensing matrix, where $2 \leq k \leq K$; and a recovering unit 630 configured to recover the original signal after the second determining unit 620 determines the $K^{th}$ array most correlative to the measured value of the original signal in the sensing matrix.

Optionally, the second determining unit 620 is configured to, from the correlation between the $(k-1)^{th}$ residual error and the multiple columns in the sensing matrix, subtract a product of a $(k-1)^{th}$ base difference and a $(k-1)^{th}$ difference coefficient to obtain the correlation between the $k^{th}$ residual error and the multiple columns in the sensing matrix, where the $(k-1)^{th}$ base difference is a vector or a vector set, and the $(k-1)^{th}$ difference coefficient is a scalar or a scalar set or a set of vectors composed of multiple scalars.

Optionally, the second determining unit 620 is further configured to: if $k=2$, determine a first base difference; if $k=3$, determine the $(k-1)^{th}$ base difference according to a first base difference; or if $k \geq 4$, determine the $(k-1)^{th}$ base difference according to first to $(k-2)^{th}$ base differences.

Optionally, the second determining unit 620 is configured to determine the first base difference $\bar{t}_{N-1}$ by using formula $\bar{t}_1 = \lambda_1 \cdot \theta_{(\rho_1)}$; and determine the $(k-1)^{th}$ base difference by using formula $\bar{t}_{k-1} = -\lambda_{k-1} T_{k-2} \tilde{u}_{k-2} + \lambda_{k-1} \theta_{(\rho_{k-1})}$, where $\lambda_1 = \sqrt{1/\theta_{\rho_1,\rho_1}}$, $\theta_{(\rho_1)}$ is a $\rho_1^{th}$ column of $\Theta$, $\theta_{\rho_1,\rho_1}$ is an item in a $\rho_1^{th}$ row and a $\rho_1^{th}$ column in $\Theta$, $\Theta$ is a correlation matrix of the sensing matrix, $\rho_1$ is a sequence number of a column in the sensing matrix, where the column is a column of a first array most correlative to the measured value of the original signal in the sensing matrix, $T_1 = [\bar{t}_1]$, $T_{k-2} = [T_{k-3} \, \bar{t}_{k-2}]$, $\lambda_{k-1} = 1/\sqrt{\theta_{\rho_{k-1},\rho_{k-1}} - \tilde{u}_{k-2}^H \tilde{u}_{k-2}}$, $\tilde{u}_{k-2} = (\bar{t}_{(\rho,:)})^H$, $\theta_{\rho_{k-1},\rho_{k-1}}$ is an item in a $(\rho_{k-1})$th row and a $(\rho_{k-1})^{th}$ column in $\Theta$, $\bar{t}_{(\rho_k;:)}^H$ is a $(\rho_k)^{th}$ row in $T_{k-2}$, and $\rho_{k-1}$ is a sequence number of a column in the sensing matrix, where the column is a column of a $(k-1)^{th}$ array most correlative to the measured value of the original signal in the sensing matrix.

Optionally, the second determining unit 620 is further configured to determine the $k^{th}$ difference coefficient $\alpha_k$ by using formula $\alpha_k = \lambda_k q_{\rho_k}^{k-1}$.

Figure 8:
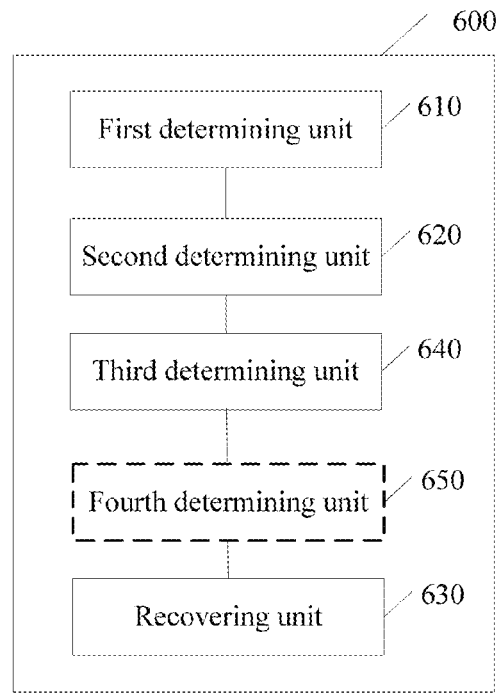
FIG. 8 is a schematic block diagram of a signal reconstruction apparatus according to another embodiment of the present invention.

Optionally, as shown in FIG. 8, the apparatus further includes a third determining unit 640 configured to determine $F_1$ by using formula $F_1 = [\lambda_1]$, and if $2 \leq k \leq K$, determine $F_k$ by using formula $$F_k = \begin{bmatrix} F_{k-1} & u_{k-1} \\ 0_{k-1}^T & \lambda_k \end{bmatrix},$$

where $u_{k-1} = -\lambda_k F_{k-1} \tilde{u}_{k-1}$; and the recovering unit is configured to recover the signal according to the $F_K$.

Optionally, the recovering unit 640 is configured to determine a weight coefficient column vector $z_K$ by using formula $z_K = F_K a_K$; determine x according to the weight coefficient column vector to make $\hat{x}_{\tau_k} = z_k$, where $z_k$ is a $k^{th}$ item of $z_K$, and $\tau_k$ is a column in an array most correlative to the measured value of the original signal in the sensing matrix; and obtain the original signal according to the x.

Optionally, the second determining unit 620 is configured to determine a first column and a second column of $T_2$ as a first base difference; and determine a $(2k-3)^{th}$ column and a $(2k-2)^{th}$ column of $T_{2k-2}$ as the $(k-1)^{th}$ base difference, where:

$T_2 = [\lambda_1 \theta_{(\rho_1)} \; f_{1,2} \theta_{(\rho_1)} + \lambda_2 \times \text{flipud}(\theta^*_{(\rho_1)})]$, $T_{2k-2} = [T_{2k-4} \; \lambda_{2k-3} t_k \; (f_{2k-3,2k-2} t_{k-1} + \lambda_{2k-2} \times \text{flipud}(\tilde{t}^*_{k-1}))]$, $\lambda_1 = \sqrt{1/\theta_{\rho_1,\rho_1}}$, $\theta_{\rho_1,\rho_1}$ represents an item in a $\rho_1^{th}$ row and a $\rho_1^{th}$ column in the sensing matrix $\Theta$, $\theta_{(\rho_1)}$ is the $\rho_1^{th}$ column in the sensing matrix $\Theta$, $f_{1,2} = -\lambda_2 \lambda_1 u''_1$, $\lambda_2 = 1/\sqrt{\theta_{\rho_1,\rho_1} - (u''_1)^* u''_1}$, $u''_1 = \lambda_1 \times \theta_{\rho_1,N-\rho_1+1}$, $\theta_{\rho_1,N-\rho_1+1}$ represents an item in the $\rho_1^{th}$ row and a $(N-\rho_1+1)^{th}$ column in the sensing matrix $\Theta$, $q_{\rho_1,:}^H$ is the $\rho_1^{th}$ row in Q, Q is a matrix composed of correlations between the first residual error and the multiple columns in the sensing matrix, $\lambda_{2k-3} = 1/\sqrt{\theta_{\rho_{k-1},\rho_{k-1}} - \tilde{u}'_{2k-4}^H \tilde{u}'_{2k-4}}$, $\tilde{u}'_{2k-4} = (T_{2k-4}(\bar{\rho}_{k-1},:))^H$, $T_{2k-4}(\bar{\rho}_{k-1},:)$ represents a $\bar{\rho}_{k-1}^{th}$ row in the matrix $T_{2k-4}$, $f_{2k-3,2k-2} = -\lambda_{2k-2} \lambda_{2k-3} \tilde{u}''_{2k-3}$, $\lambda_{2k-2} = 1/\sqrt{1/\lambda_{2k-3}^2 - |\tilde{u}''_{2k-3}|^2}$, $\tilde{u}''_{2k-3} = \lambda_{2k-3} (\theta_{\bar{\rho}_{k-1},\rho_{k-1}} - T_{2k-4}(\bar{\rho}_{k-1},:) \times \tilde{u}'_{2k-4})^*$, $\bar{t}_{k-1} = \theta_{(\rho_{k-1})} - T_{2k-4} \tilde{u}'_{2k-4}$, and $\theta_{(\rho_{k-1})}$ is a $\rho_{k-1}^{th}$ column in the matrix $\Theta$.

Optionally, the second determining unit 620 is further configured to: determine a first row and a second row of $A_2$ as a first difference coefficient; and determine a $(2k-3)^{th}$ row and a $(2k-2)^{th}$ row of $A_{2k-2}$ as the $(k-1)^{th}$ difference coefficient, where:

$$A_{2k-2} = \begin{bmatrix} A_{(2k-4)} \\ \lambda_{2k-3} \tilde{a}_{2k-4,:}^H \\ (f_{2k-3,2k-2})^* \tilde{a}_{2k-4,:}^H + \lambda_{2k-2} (\tilde{a}_{2k-4,:}^H)^* \end{bmatrix},$$

and $$A_2 = \begin{bmatrix} \lambda_1 q_{\rho_1,:}^H \\ f_{1,2}^* q_{\rho_1,:}^H + \lambda_2 (q_{\rho_1,:}^H)^* \end{bmatrix}.$$

Optionally, as shown in FIG. 8, the apparatus 600 further includes a fourth unit 650 configured to determine $F_2$ by using formula $$F_2 = \begin{bmatrix} \lambda_1 & f_{1,2} \\ 0 & \lambda_2 \end{bmatrix},$$

and if $2 \leq k \leq K$, determine $F_{2k}$ by using formula $$F_{2k} = \begin{bmatrix} F_{2k-2} & -\lambda_{2k-1} w_{2k-2} & (-f_{2k-1,2k} w_{2k-2} - \lambda_{2k} \times \text{reorder}(w_{2k-2})) \\ 0_{2k-2}^H & \lambda_{2k-1} & f_{2k-1,2k} \\ 0_{2k-2}^H & 0 & \lambda_{2k} \end{bmatrix},$$

where reorder($w_{2k-2}$) refers to exchanging positions of a $(2i-1)^{th}$ item and a $2i^{th}$ item of a vector $w_{2k-2}$, and then calculating a conjugate of each item of the vector, where $i=1, 2, \ldots, k-1$, and $w_{2k-2} = F_{2k-2} \tilde{u}'_{2k-2}$; and the recovering unit is configured to recover the signal according to the $F_{2K}$.

Therefore, in the embodiment of the present invention, the correlation between the $k^{th}$ residual error and the multiple columns in the sensing matrix is determined according to the correlation between the $(k-1)^{th}$ residual error and the multiple columns in the sensing matrix, and a column most correlative to the measured value of the original signal in the sensing matrix is further determined for recovering the signal. In this way, under the premise of ensuring proper recovery of the signal, the amount of calculation for reconstructing the signal can be reduced.

Figure 9:
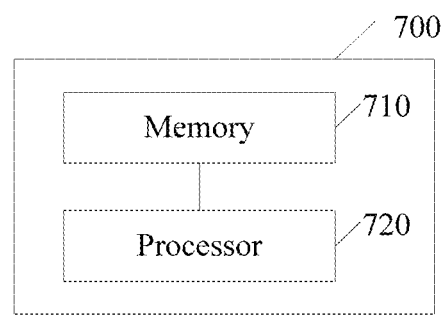
FIG. 9 is a schematic block diagram of a signal reconstruction apparatus according to another embodiment of the present invention.

FIG. 9 is a schematic block diagram of a signal reconstruction apparatus 700 according to an embodiment of the present invention. As shown in FIG. 9, the apparatus 700 includes a memory 710 and a processor 720, where the memory 710 stores program codes, and the processor 720 is configured to invoke the program codes to perform the following operations: determining a correlation between a first residual error and multiple columns in a sensing matrix according to a measured value of an original signal and the sensing matrix, and determining a first array most correlative to the measured value of the original signal in the sensing matrix according to the correlation between the first residual error and the multiple columns in the sensing matrix; determining a correlation between a $k^{th}$ residual error and the multiple columns in the sensing matrix according to a correlation between a $(k-1)^{th}$ residual error and the multiple columns in the sensing matrix, and determining a $k^{th}$ array most correlative to the measured value of the original signal in the sensing matrix according to the correlation between the $k^{th}$ residual error and the multiple columns in the sensing matrix, where $2 \le k \le K$; and recovering the original signal after determining the $K^{th}$ array most correlative to the measured value of the original signal in the sensing matrix.

Optionally, the processor 720 is configured to invoke the program codes to perform the following operations: from the correlation between the $(k-1)^{th}$ residual error and the multiple columns in the sensing matrix, subtracting a product of a $(k-1)^{th}$ base difference and a $(k-1)^{th}$ difference coefficient to obtain the correlation between the $k^{th}$ residual error and the multiple columns in the sensing matrix, where the $(k-1)^{th}$ base difference is a vector or a vector set, and the $(k-1)^{th}$ difference coefficient is a scalar or a scalar set or a set of vectors composed of multiple scalars.

Optionally, the processor 720 is configured to invoke the program codes to perform the following operations: if $k=2$, determining a first base difference; if $k=3$, determining the $(k-1)^{th}$ base difference according to a first base difference; or if $k \ge 4$, determining the $(k-1)^{th}$ base difference according to first to $(k-2)^{th}$ base differences.

Optionally, the processor 720 is configured to invoke the program codes to perform the following operations: determining the first base difference $\bar{t}_{N-1}$ by using formula $\bar{t}_1 = \lambda_1 \cdot \theta_{(\rho_1)}$; and determining the $(k-1)^{th}$ base difference by using formula $\bar{t}_{k-1} = -\lambda_{k-1} T_{k-2} \tilde{u}_{k-2} + \lambda_{k-1} \theta_{(\rho_{k-1})}$, where $\lambda_1 = \sqrt{1/\theta_{\rho_1, \rho_1}}$, $\theta_{(\rho_1)}$ is a $\rho_1^{th}$ column of $\Theta$, $\theta_{\rho_1, \rho_1}$ is an item in a $\rho_1^{th}$ row and a $\rho_1^{th}$ column in $\Theta$, $\Theta$ is a correlation matrix of the sensing matrix, $\rho_1$ is a sequence number of a column in the sensing matrix, where the column is a column of a first array most correlative to the measured value of the original signal in the sensing matrix, $T_1 = [\bar{t}_1]$, $T_{k-2} = [T_{k-3} \; \bar{t}_{k-2}]$, $\lambda_{k-1} = 1/\sqrt{\theta_{\rho_{k-1}, \rho_{k-1}} - \tilde{u}_{k-2}^H \tilde{u}_{k-2}}$, $\tilde{u}_{k-2} = (\bar{t}_{(\rho, :)}^H)^H$, $\theta_{\rho_{k-1}, \rho_{k-1}}$ is an item in a $(\rho_{k-1})^{th}$ row and a $(\rho_{k-1})^{th}$ column in $\Theta$, $t_{(\rho_k, :)}^H$ is a $(\rho_{k-1})^{th}$ row in $T_{k-2}$, and $\rho_{k-1}$ is a sequence number of a column in the sensing matrix, where the column is a column of a $(k-1)^{th}$ array most correlative to the measured value of the original signal in the sensing matrix.

Optionally, the processor 720 is configured to invoke the program codes to perform the following operations: determining the $k^{th}$ difference coefficient $\alpha_k$ by using formula $\alpha_k = \lambda_k q_{\rho_k}^{k-1}$.

Optionally, the processor 720 is configured to invoke the program codes to perform the following operations: determining $F_1$ by using formula $F_1 = [\lambda_1]$; if $2 \le k \le K$, determining $F_k$ by using formula $$F_k = \begin{bmatrix} F_{k-1} & u_{k-1} \\ 0_{k-1}^T & \lambda_k \end{bmatrix},$$

where $u_{k-1} = -\lambda_k F_{k-1} \tilde{u}_{k-1}$; and recovering the signal according to the $F_K$.

Optionally, the processor 720 is configured to invoke the program codes to perform the following operations: determining a weight coefficient column vector $z_K$ by using formula $z_K = F_K a_K$; determining x according to the weight coefficient column vector to make $\hat{x}_{\tau_k} = z_k$, where $z_k$ is a $k^{th}$ item of $z_K$, and $\tau_k$ is a column in an array most correlative to the measured value of the original signal in the sensing matrix; and obtaining the original signal according to the x.

Optionally, the processor 720 is configured to invoke the program codes to perform the following operations: determining a first column and a second column of $T_2$ as a first base difference; and determining a $(2k-3)^{th}$ column and a $(2k-2)^{th}$ column of $T_{2k-2}$ as the $(k-1)^{th}$ base difference, where:
$T_2 = [\lambda_1 \theta_{(\rho_1)} \; f_{1,2} \theta_{(\rho_1)} + \lambda_2 \times \text{flipud}(\theta^*_{(\rho_1)})]$,
$T_{2k-2} = [T_{2k-4} \; \lambda_{2k-3} t_k \; (f_{2k-3, 2k-2} t_{k-1} + \lambda_{2k-2} \times \text{flipud}(\tilde{t}^*_{k-1}))]$,
$\lambda_1 = \sqrt{1/\theta_{\rho_1, \rho_1}}$, $\theta_{\rho_1, \rho_1}$ represents an item in a $\rho_1^{th}$ row and a $\rho_1^{th}$ column in the sensing matrix $\Theta$, $\theta_{(\rho_1)}$ is the $\rho_1^{th}$ column in the sensing matrix $\Theta$, $f_{1,2} = -\lambda_2 \lambda_1 u''_1$, $\lambda_2 = 1/\sqrt{\theta_{\rho_1, \rho_1} - (u''_1)^* u''_1}$, $u''_1 = \lambda_1 \times \theta_{\rho_1, N-\rho_1+1}$, $\theta_{\rho_1, N-\rho_1+1}$ represents an item in the $\rho_1^{th}$ row and a $(N-\rho_1+1)^{th}$ column in the sensing matrix $\Theta$, $q_{\rho_1, :}^H$ is the $\rho_1^{th}$ row in Q, Q is a matrix composed of correlations between the first residual error and the multiple columns in the sensing matrix, $\lambda_{2k-3} = 1/\sqrt{\theta_{\rho_{k-1}, \rho_{k-1}} - \tilde{u}'_{2k-4}^H \tilde{u}'_{2k-4}}$, $\tilde{u}'_{2k-4} = (T_{2k-4}(\bar{\rho}_{k-1}, :))^H$, $T_{2k-4}(\bar{\rho}_{k-1}, :)$ represents a $(\bar{\rho}_{k-1})^{th}$ row in the matrix $T_{2k-4}$, $f_{2k-3, 2k-2} = -\lambda_{2k-2} \lambda_{2k-3} \tilde{u}''_{2k-3}$, $\lambda_{2k-2} = 1/\sqrt{1/\lambda_{2k-3}^2 - |\tilde{u}''_{2k-3}|^2}$, $\tilde{u}''_{2k-3} = \lambda_{2k-3}(\theta_{\bar{\rho}_{k-1}, \rho_{k-1}} - T_{2k-4}(\bar{\rho}_{k-1}, :) \times \tilde{u}'_{2k-4})^*$, $t_{k-1} = \theta_{(\rho_{k-1})} - T_{2k-4} \tilde{u}'_{2k-4}$, and $\theta_{(\rho_{k-1})}$ is a $\rho_{k-1}^{th}$ column in the matrix $\Theta$.

Optionally, the processor 720 is configured to invoke the program codes to perform the following operations: determining a first row and a second row of $A_2$ as a first difference coefficient; and determining a $(2k-3)^{th}$ row and a $(2k-2)^{th}$ row of $A_{2k-2}$ as the $(k-1)^{th}$ difference coefficient, where:

$$A_{2k-2} = \begin{bmatrix} A_{(2k-4)} \\ \lambda_{2k-3} \tilde{a}_{2k-4, :}^H \\ (f_{2k-3, 2k-2})^* \tilde{a}_{2k-4, :}^H + \lambda_{2k-2} (\tilde{a}_{2k-4, :}^H)^* \end{bmatrix},$$

and $$A_2 = \begin{bmatrix} \lambda_1 q_{\rho_1, :}^H \\ f_{1,2}^* q_{\rho_1, :}^H + \lambda_2 (q_{\rho_1, :}^H)^* \end{bmatrix}.$$

Optionally, the processor 720 is configured to invoke the program codes to perform the following operations determining $F_2$ by using formula $$F_2 = \begin{bmatrix} \lambda_1 & f_{1,2} \\ 0 & \lambda_2 \end{bmatrix};$$

if $2 \le k \le K$, determine $F_{2k}$ by using formula:

$$F_{2k} = \begin{bmatrix} F_{2k-2} & -\lambda_{2k-1} w_{2k-2} & (-f_{2k-1, 2k} w_{2k-2} - \lambda_{2k} \times \text{reorder}(w_{2k-2})) \\ 0_{2k-2}^H & \lambda_{2k-1} & f_{2k-1, 2k} \\ 0_{2k-2}^H & 0 & \lambda_{2k} \end{bmatrix},$$

where $\text{reorder}(w_{2k-2})$ refers to exchanging positions of a $(2i-1)^{th}$ item and a $2i^{th}$ item of a vector $w_{2k-2}$, and then calculating a conjugate of each item of the vector, where $i=1, 2, \ldots, k-1$, and $w_{2k-2} = F_{2k-2} \tilde{u}'_{2k-2}$; and recovering the signal according to the $F_{2K}$.

Therefore, in the embodiment of the present invention, the correlation between the $k^{th}$ residual error and the multiple columns in the sensing matrix is determined according to the correlation between the $(k-1)^{th}$ residual error and the multiple columns in the sensing matrix, and a column most correlative to the measured value of the original signal in the sensing matrix is further determined for recovering the signal. In this way, under the premise of ensuring proper recovery of the signal, the amount of calculation for reconstructing the signal can be reduced.

What is claimed is:

1. A signal reconstruction method, comprising:
   determining a correlation between a first residual error and multiple columns in a sensing matrix according to a measured value of an original signal and the sensing matrix;
   determining a first array most correlative to the measured value of the original signal in the sensing matrix according to the correlation between the first residual error and the multiple columns in the sensing matrix;
   determining a correlation between a $k^{th}$ residual error and the multiple columns in the sensing matrix according to a correlation between a $(k-1)^{th}$ residual error and the multiple columns in the sensing matrix;
   determining a $k^{th}$ array most correlative to the measured value of the original signal in the sensing matrix according to the correlation between the $k^{th}$ residual error and the multiple columns in the sensing matrix, wherein $2 \leq k \leq K$; and
   recovering the original signal after determining a $K^{th}$ array most correlative to the measured value of the original signal in the sensing matrix,
   wherein determining the correlation between the $k^{th}$ residual error and the multiple columns in the sensing matrix according to the correlation between the $(k-1)^{th}$ residual error and the multiple columns in the sensing matrix comprises, from the correlation between the $(k-1)^{th}$ residual error and the multiple columns in the sensing matrix, subtracting a product of a $(k-1)^{th}$ base difference and a $(k-1)^{th}$ difference coefficient to obtain the correlation between the $k^{th}$ residual error and the multiple columns in the sensing matrix, wherein the $(k-1)^{th}$ base difference is a vector or a vector set, and the $(k-1)^{th}$ difference coefficient is a scalar or a scalar set or a set of vectors composed of multiple scalars.

2. The method according to claim 1, wherein before the from the correlation between the $(k-1)^{th}$ residual error and the multiple columns in the sensing matrix, subtracting a product of a $(k-1)^{th}$ base difference and a $(k-1)^{th}$ difference coefficient to obtain the correlation between the $k^{th}$ residual error and the multiple columns in the sensing matrix, the determining a correlation between a $k^{th}$ residual error and the multiple columns in the sensing matrix further comprises:
   determining a first base difference when $k=2$;
   determining the $(k-1)^{th}$ base difference according to a first base difference when $k=3$; or
   determining the $(k-1)^{th}$ base difference according to first to $(k-2)^{th}$ base differences when $k \geq 4$.

3. The method according to claim 2, wherein the determining a first base difference comprises determining the first base difference $\bar{t}_{N-1}$ by using formula $\bar{t}_1 = \lambda_1 \cdot \theta_{(\rho_1)}$; and the determining the $(k-1)^{th}$ base difference comprises determining the $(k-1)^{th}$ base difference by using formula $\bar{t}_{k-1} = -\lambda_{k-1} T_{k-2} \tilde{u}_{k-2} + \lambda_{k-1} \theta_{(\rho_{k-1})}$, wherein $\lambda_1 = \sqrt{1/\theta_{\rho_1,\rho_1}}$, $\theta_{(\rho_1)}$ is a $\rho_1^{th}$ column of $\Theta$, $\theta_{\rho_1,\rho_1}$ is an item in a $\rho_1^{th}$ row and a $\rho_1^{th}$ column in $\Theta$, $\Theta$ is a correlation matrix of the sensing matrix, $\rho_1$ is a sequence number of a column in the sensing matrix, wherein the column is a column of a first array most correlative to the measured value of the original signal in the sensing matrix, $T_1 = [\bar{t}_1]$, $T_{k-2} = [T_{k-3} \ \bar{t}_{k-2}]$, $\lambda_{k-1} = 1/\sqrt{\theta_{\rho_{k-1},\rho_{k-1}} - \tilde{u}_{k-2}^H \tilde{u}_{k-2}}$, $\tilde{u}_{k-2} = (\bar{t}_{(\rho_k,:)}^H)^H$, $\theta_{\rho_{k-1},\rho_{k-1}}$ is an item in a $\rho_{k-1}^{th}$ row and a $\rho_{k-1}^{th}$ column in $\Theta$, $\bar{t}_{(\rho_k,:)}$ is a $(\rho_{k-1})^{th}$ row in $T_{k-2}$, and $\rho_{k-1}$ is a sequence number of a column in the sensing matrix, wherein the column is a column of a $(k-1)^{th}$ array most correlative to the measured value of the original signal in the sensing matrix.

4. The method according to claim 3, wherein before the from the correlation between the $(k-1)^{th}$ residual error and the multiple columns in the sensing matrix, subtracting a product of a $(k-1)^{th}$ base difference and a $(k-1)^{th}$ difference coefficient to obtain the correlation between the $k^{th}$ residual error and the multiple columns in the sensing matrix, the determining a correlation between a $k^{th}$ residual error and the multiple columns in the sensing matrix further comprises determining a $k^{th}$ difference coefficient $\alpha_k$ by using formula $\alpha_k = \lambda_k q_{\rho_k}^{K-1}$.

5. The method according to claim 3, wherein the method further comprises:
   determining $F_1$ by using formula $F_1 = [\lambda_1]$; and
   determining $F_k$ by using formula $$F_k = \begin{bmatrix} F_{k-1} & u_{k-1} \\ 0_{k-1}^T & \lambda_k \end{bmatrix}$$

when $2 \leq k \leq K$, wherein $u_{k-1} = -\lambda_k F_{k-1} \tilde{u}_{k-1}$, and
wherein the recovering the original signal of a received signal after determining a $K^{th}$ array of the base matrix comprises recovering the signal according to the $F_K$.

6. The method according to claim 5, wherein the recovering the signal according to the $F_K$ comprises:
   determining a weight coefficient column vector $z_K$ by using formula $z_K = F_K a_K$;
   determining x according to the weight coefficient column vector to make $\hat{x}_{\tau_k} = z_k$, wherein $z_k$ is a $k^{th}$ item of $z_K$, and $\tau_k$ is a column in an array most correlative to the measured value of the original signal in the sensing matrix; and
   obtaining the original signal according to the x.

7. The method according to claim 2, wherein the determining a first base difference comprises determining a first column and a second column of $T_2$ as the first base difference, wherein the determining the $(k-1)^{th}$ base difference comprises determining a $(2k-3)^{th}$ column and a $(2k-2)^{th}$ column of $T_{2k-2}$ as the $(k-1)^{th}$ base difference, and wherein
$T_2 = [\lambda_1 \theta_{(\rho_1)} \ f_{1,2} \theta_{(\rho_1)} + \lambda_2 \times \text{flipud}(\theta^*_{(\rho_1)})]$,
$T_{2k-2} = [T_{2k-4} \ \lambda_{2k-3} t_k \ (f_{2k-3,2k-2} t_{k-1} + \lambda_{2k-2} \times \text{flipud}(\tilde{t}^*_{k-1}))]$,
$\lambda_1 = \sqrt{1/\theta_{\rho_1,\rho_1}}$, $\theta_{\rho_1,\rho_1}$ represents an item in a $\rho_1^{th}$ row and a $\rho_1^{th}$ column in the sensing matrix $\Theta$, $\theta_{(\rho_1)}$ is the $\rho_1^{th}$ column in the sensing matrix $\Theta$, $f_{1,2} = -\lambda_2 \lambda_1 u''_1$, $\lambda_2 = 1/\sqrt{\theta_{\rho_1,\rho_1} - (u''_1)^* u''_1}$, $u''_1 = \lambda_1 \times \theta_{\rho_1, N-\rho_1+1}$, $\theta_{\rho_1, N-\rho_1+1}$ represents an item in the $\rho_1^{th}$ row and a $(N-\rho_1+1)^{th}$ column in the sensing matrix $\Theta$, $q_{\rho_1,:}^H$ is the $\rho_1^{th}$ row in Q, Q is a matrix composed of correlations between the first residual error and the multiple columns in the sensing matrix, $\lambda_{2k-3} = 1/\sqrt{\theta_{\bar{\rho}_{k-1},\bar{\rho}_{k-1}} - \tilde{u}'^{H}_{2k-4} \tilde{u}'_{2k-4}}$, $\tilde{u}'_{2k-4} = (T_{2k-4}(\bar{\rho}_{k-1},:))^H$, $T_{2k-4}(\bar{\rho}_{k-1},:)$ represents a $(\bar{\rho}_{k-1})^{th}$ row in the matrix $T_{2k-4}$, $f_{2k-3,2k-2} = -\lambda_{2k-2} \lambda_{2k-3} \tilde{u}''_{2k-3}$, $\lambda_{2k-2} = 1/\sqrt{1/\lambda_{2k-3}^2 - |\tilde{u}''_{2k-3}|^2}$, $\tilde{u}''_{2k-3} = \lambda_{2k-3}(\theta_{\bar{\rho}_{k-1},\rho_{k-1}} - T_{2k-4}(\bar{\rho}_{k-1},:) \times \tilde{u}'_{2k-4})^*$, $t_{k-1} = \theta_{(\rho_{k-1})} - T_{2k-4} \tilde{u}'_{2k-4}$, and $\theta_{(\rho_{k-1})}$ is a $\rho_{k-1}^{th}$ column in the matrix $\Theta$.

8. The method according to claim 7, wherein before the from the correlation between the (k−1)$^{th}$ residual error and the multiple columns in the sensing matrix, subtracting a product of a (k−1)$^{th}$ base difference and a (k−1)$^{th}$ difference coefficient to obtain the correlation between the k$^{th}$ residual error and the multiple columns in the sensing matrix, the determining a correlation between a k$^{th}$ residual error and the multiple columns in the sensing matrix further comprises:
 determining a first row and a second row of A$_2$ as a first difference coefficient; and
 determining a (2k−3)$^{th}$ row and a (2k−2)$^{th}$ row of A$_{2k-2}$ as the (k−1)$^{th}$ difference coefficient, wherein:

$$A_{2k-2} = \begin{bmatrix} A_{(2k-4)} \\ \lambda_{2k-3}\tilde{a}^H_{2k-4,:} \\ (f_{2k-3,2k-2})^* \tilde{a}^H_{2k-4,:} + \lambda_{2k-2}(\tilde{a}^H_{2k-4,:})^* \end{bmatrix},$$

and $$A_2 = \begin{bmatrix} \lambda_1 q^H_{\rho_1,:} \\ f^*_{1,2} q^H_{\rho_1,:} + \lambda_2 (q^H_{\rho_1,:})^* \end{bmatrix}.$$

9. The method according to claim 7, wherein the method further comprises:
 determining F$_2$ by using formula $$F_2 = \begin{bmatrix} \lambda_1 & f_{1,2} \\ 0 & \lambda_2 \end{bmatrix};$$

and
determining F$_{2k}$ by using formula $$F_{2k} = \begin{bmatrix} F_{2k-2} & -\lambda_{2k-1}w_{2k-2} & (-f_{2k-1,2k}w_{2k-2} - \lambda_{2k} \times \text{reorder}(w_{2k-2})) \\ 0^H_{2k-2} & \lambda_{2k-1} & f_{2k-1,2k} \\ 0^H_{2k-2} & 0 & \lambda_{2k} \end{bmatrix}$$

when 2≤k≤K, wherein reorder(w$_{2k-2}$) refers to exchanging positions of a (2i−1)$^{th}$ item and a 2i$^{th}$ item of a vector w$_{2k-2}$, and then calculating a conjugate of each item of the vector, wherein i=1,2, . . . , k−1, and w$_{2k-2}$=F$_{2k-2}$ũ'$_{2k-2}$, and
 wherein the recovering the original signal of a received signal after determining a K$^{th}$ column of the base matrix comprises recovering the signal according to the F$_{2K}$.

10. A signal reconstruction apparatus, comprising:
a memory; and
a processor,
wherein the memory stores program codes, and wherein the processor is configured to invoke the program codes to perform the following operations:
 determining a correlation between a first residual error and multiple columns in a sensing matrix according to a measured value of an original signal and the sensing matrix;
 determining a first array most correlative to the measured value of the original signal in the sensing matrix according to the correlation between the first residual error and the multiple columns in the sensing matrix;
 determining a correlation between a k$^{th}$ residual error and the multiple columns in the sensing matrix according to a correlation between a (k−1)$^{th}$ residual error and the multiple columns in the sensing matrix;
 determining a k$^{th}$ array most correlative to the measured value of the original signal in the sensing matrix according to the correlation between the k$^{th}$ residual error and the multiple columns in the sensing matrix, wherein 2≤k≤K;
 recovering the original signal after determining a K$^{th}$ array most correlative to the measured value of the original signal in the sensing matrix; and
 subtracting, from the correlation between the (k−1)$^{th}$ residual error and the multiple columns in the sensing matrix, a product of a (k−1)$^{th}$ base difference and a (k−1)$^{th}$ difference coefficient to obtain the correlation between the k$^{th}$ residual error and the multiple columns in the sensing matrix,
 wherein the (k−1)$^{th}$ base difference is a vector or a vector set, and the (k−1)$^{th}$ difference coefficient is a scalar or a scalar set or a set of vectors composed of multiple scalars.

11. The apparatus according to claim 10, wherein the processor is configured to invoke the program codes to perform the following operations:
 determining a first base difference when k=2;
 determining the (k−1)$^{th}$ base difference according to a first base difference when k=3; or
 determining the (k−1)$^{th}$ base difference according to first to (k−2)$^{th}$ base differences when k≥4.

12. The apparatus according to claim 11, wherein the processor is configured to invoke the program codes to perform the following operations:
 determining the first base difference $\bar{t}_{N-1}$ by using formula $\bar{t}_1 = \lambda_1 \cdot \theta_{(\rho_1)}$; and
 determining the (k−1)$^{th}$ base difference by using formula $\bar{t}_{k-1} = -\lambda_{k-1}T_{k-2}\tilde{u}_{k-2} + \lambda_{k-1}\theta_{(\rho_{k-1})}$, wherein $\lambda_1 = \sqrt{1/\theta_{\rho_1,\rho_1}}$, $\theta_{(\rho_1)}$ is a $\rho_1^{th}$ column of Θ, $\theta_{\rho_1,\rho_1}$ is an item in a $\rho_1^{th}$ row and a $\rho_1^{th}$ column in Θ, Θ is a correlation matrix of the sensing matrix, $\rho_1$ is a sequence number of a column in the sensing matrix, wherein the column is a column of a first array most correlative to the measured value of the original signal in the sensing matrix, $T_1 = [\bar{t}_1]$, $T_{k-2} = [T_{k-3} \bar{t}_{k-2}]$, $\lambda_{k-1} = 1/\sqrt{\theta_{\rho_{k-1},\rho_{k-1}} - \tilde{u}_{k-2}^H \tilde{u}_{k-2}}$, $\tilde{u}_{k-2} = (\bar{t}_{\rho,:})^H)^H$, $\theta_{\rho_{k-1}}$, $\rho_{k-1}$ is an item in a $(\rho_{k-1})^{th}$ row and a $(\rho_{k-1})^{th}$ column in Θ, $\bar{t}^H_{(\rho_k,:)}$ is a $(\rho_{k-1})^{th}$ row in $T_{k-2}$, and $\rho_{k-1}$ is a sequence number of a column in the sensing matrix, wherein the column is a column of a (k−1)$^{th}$ array most correlative to the measured value of the original signal in the sensing matrix.

13. The apparatus according to claim 12, wherein the processor is configured to invoke the program codes to perform the following operations: determining the k$^{th}$ difference coefficient $\alpha_k$ by using formula $\alpha_k = \lambda_k q_{\rho_k}^{k-1}$.

14. The apparatus according to claim 12, wherein the processor is configured to invoke the program codes to perform the following operations:
 determining F$_1$ by using formula F$_1$=[λ$_1$];
 determining F$_k$ by using formula $$F_k = \begin{bmatrix} F_{k-1} & u_{k-1} \\ 0^T_{k-1} & \lambda_k \end{bmatrix}$$

when 2≤k≤K, wherein u$_{k-1}$=−λ$_k$F$_{k-1}$ũ$_{k-1}$; and
recovering the signal according to the F$_K$.

15. The apparatus according to claim 14, wherein the processor is configured to invoke the program codes to perform the following operations:

determining a weight coefficient column vector $z_K$ by using formula $z_K = F_K a_K$;

determining x according to the weight coefficient column vector to make $\hat{x}_{\tau_k} = z_k$, wherein $z_k$ is a $k^{th}$ item of $z_K$, and $\tau_k$ is a column in an array most correlative to the measured value of the original signal in the sensing matrix; and obtaining the original signal according to the x.

16. The apparatus according to claim 11, wherein the processor is configured to invoke the program codes to perform the following operations:

determining a first column and a second column of $T_2$ as a first base difference; and determining a $(2k-3)^{th}$ column and a $(2k-2)^{th}$ column of $T_{2k-2}$ as the $(k-1)^{th}$ base difference, wherein $T_2 = [\lambda_1 \theta_{(\rho_1)} f_{1,2}\theta_{(\rho_1)} + \lambda_2 \times \text{flipud}(\theta^*_{(\rho_1)})]$, $T_{2k-2} = [\tilde{T}_{2k-4} \ \lambda_{2k-3}\tilde{t}_k \ (f_{2k-3,2k-2}\tilde{t}_{k-1} + \lambda_{2k-2} \times \text{flipud}(\tilde{t}^*_{k-1}))]$, $\lambda_1 = \sqrt{1/\theta_{\rho_1,\rho_1}}$, $\theta_{\rho_1,\rho_1}$ represents an item in a $\rho_1^{th}$ row and a $\rho_1^{th}$ column in the sensing matrix $\Theta$, $\theta_{(\rho_1)}$ is the $\rho_1^{th}$ column in the sensing matrix $\Theta$, $f_{1,2} = -\lambda_2\lambda_1 u''_1$, $\lambda_2 = 1/\sqrt{\theta_{\rho_1,92_1} - (u''_1)^* u''_1}$, $u''_1 = \lambda_1 \times \theta_{\rho_1,N-\rho_1+1}$, $\theta_{\rho_1,N-\rho_1+1}$ represents an item in the $\rho_1^{th}$ row and a $(N-\rho_1+1)^{th}$ column in the sensing matrix $\Theta$, $q_{\rho_1,:}^H$ is the $\rho_1^{th}$ row in Q, Q is a matrix composed of correlations between the first residual error and the multiple columns in the sensing matrix, $\lambda_{2k-3} = 1/\sqrt{\theta_{\overline{\rho}_{k-1},\overline{\rho}_{k-1}} - \tilde{u}'_{2k-4}{}^H \tilde{u}'_{2k-4}}$, $\tilde{u}'_{2k-4} = (T_{2k-4}(\overline{\rho}_{k-1},:))^H$, $T_{2k-4}(\overline{\rho}_{k-1},:)$ represents a $(\overline{\rho}_{k-1})^{th}$ row in the matrix $T_{2k-4}$, $f_{2k-3,2k-2} = -\lambda_{2k-2}\lambda_{2k-3}\tilde{u}''_{2k-3}$, $\lambda_{2k-2} = 1/\sqrt{1/\lambda_{2k-3}^2 - |\tilde{u}''_{2k-3}|^2}$, $\tilde{u}''_{2k-3} = \lambda_{2k-3}(\theta_{\overline{\rho}_{k-1},\rho_{k-1}} - T_{2k-4}(\overline{\rho}_{k-1},:) \times \tilde{u}'_{2k-4})^*$, $\tilde{t}_{k-1} = \theta_{(\rho_{k-1})} - T_{2k-4}\tilde{u}'_{2k-4}$, and $\theta_{(\rho_{k-1})}$ is a $(\rho_{k-1})^{th}$ column in the matrix $\Theta$.

17. The apparatus according to claim 16, wherein the processor is configured to invoke the program codes to perform the following operations:

determining a first row and a second row of $A_2$ as a first difference coefficient; and determining a $(2k-3)^{th}$ row and a $(2k-2)^{th}$ row of $A_{2k-2}$ as the $(k-1)^{th}$ difference coefficient, wherein:

$$A_{2k-2} = \begin{bmatrix} A_{(2k-4)} \\ \lambda_{2k-3}\tilde{a}^H_{2k-4,:} \\ (f_{2k-3,2k-2})^* \tilde{a}^H_{2k-4,:} + \lambda_{2k-2}(\tilde{a}^H_{2k-4,:})^* \end{bmatrix},$$

and $$A_2 = \begin{bmatrix} \lambda_1 q^H_{\rho_1,:} \\ f^*_{1,2} q^H_{\rho_1,:} + \lambda_2 (q^H_{\rho_1,:})^* \end{bmatrix}.$$

18. The apparatus according to claim 16, wherein the processor is configured to invoke the program codes to perform the following operations:

determining $F_2$ by using formula $$F_2 = \begin{bmatrix} \lambda_1 & f_{1,2} \\ 0 & \lambda_2 \end{bmatrix};$$

determining $F_{2k}$ by using formula $$F_{2k} = \begin{bmatrix} F_{2k-2} & -\lambda_{2k-1}w_{2k-2} & (-f_{2k-1,2k}w_{2k-2} - \lambda_{2k} \times \text{reorder}(w_{2k-2})) \\ 0^H_{2k-2} & \lambda_{2k-1} & f_{2k-1,2k} \\ 0^H_{2k-2} & 0 & \lambda_{2k} \end{bmatrix}$$

when $2 \leq k \leq K$, wherein $\text{reorder}(w_{2k-2})$ refers to exchanging positions of a $(2i-1)^{th}$ item and a $2i^{th}$ item of a vector $w_{2k-2}$, and then calculating a conjugate of each item of the vector, wherein $i = 1, 2, \ldots, k-1$, and $W_{2k-2} = F_{2k-2}\tilde{u}'_{2k-2}$; and recovering the signal according to the $F_{2K}$.

* * * * *